(12) United States Patent
Yamazaki et al.

(10) Patent No.: US 10,297,440 B2
(45) Date of Patent: May 21, 2019

(54) METHOD OF MANUFACTURING SEMICONDUCTOR DEVICE

(71) Applicant: HITACHI KOKUSAI ELECTRIC INC., Tokyo (JP)

(72) Inventors: Hirohisa Yamazaki, Toyama (JP); Noriyuki Isobe, Toyama (JP); Hiroshi Ashihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/275,854

(22) Filed: Sep. 26, 2016

(65) Prior Publication Data

US 2017/0092490 A1   Mar. 30, 2017

(30) Foreign Application Priority Data

Sep. 30, 2015  (JP) ................................. 2015-194500

(51) Int. Cl.
*C23C 16/40* (2006.01)
*H01L 21/02* (2006.01)
(Continued)

(52) U.S. Cl.
CPC ...... *H01L 21/02186* (2013.01); *C23C 16/405* (2013.01); *C23C 16/45531* (2013.01); *H01L 21/022* (2013.01); *H01L 21/0228* (2013.01); *H01L 21/0337* (2013.01); *H01L 29/7843* (2013.01)

(58) Field of Classification Search
None
See application file for complete search history.

(56) References Cited

U.S. PATENT DOCUMENTS

2005/0118428 A1* 6/2005 Bicker ..................... B05D 1/62
428/411.1
2008/0102205 A1* 5/2008 Barry ..................... C23C 16/18
427/250

(Continued)

FOREIGN PATENT DOCUMENTS

JP   2008-085612 A   4/2008
JP     2014-11357 A   1/2014
WO   2013/027549 A1   2/2013

OTHER PUBLICATIONS

Japanese Office Action for Japanese Patent Application No. 2015-194500 dated Jan. 17, 2017.

*Primary Examiner* — Charles D Garber
*Assistant Examiner* — Xiaoming Liu
(74) *Attorney, Agent, or Firm* — Volpe and Koenig, P.C.

(57) ABSTRACT

Provided is a technique for forming a film having a desired stress on a substrate. A method of manufacturing a semiconductor device includes: forming a film having a predetermined stress on a substrate by controlling a ratio of a thickness of a first film having compressive stress to a thickness of a second film having tensile stress by performing: (a) supplying an organic source gas containing a first element and a reactive gas containing a second element to the substrate to form the first film containing the first element and the second element; and (b) supplying an inorganic source gas containing the first element and the reactive gas to the substrate to form the second film containing the first element and the second element.

7 Claims, 10 Drawing Sheets

(51) Int. Cl.
*H01L 21/033* (2006.01)
*H01L 29/78* (2006.01)
*C23C 16/455* (2006.01)

(56) References Cited

U.S. PATENT DOCUMENTS

| | | | |
|---|---|---|---|
| 2013/0203643 A1* | 8/2013 | Nakanishi | C11D 3/0042 510/175 |
| 2014/0004713 A1 | 1/2014 | Igeta et al. | |
| 2014/0175664 A1* | 6/2014 | Hagleitner | H01L 21/28506 257/774 |
| 2014/0240821 A1* | 8/2014 | Ballou | G02B 5/0858 359/360 |
| 2015/0126042 A1* | 5/2015 | Pasquale | H01L 21/02274 438/761 |

* cited by examiner

METHOD OF MANUFACTURING SEMICONDUCTOR DEVICE

CROSS-REFERENCE TO RELATED PATENT APPLICATION

The non-provisional U.S. patent application claims priority under 35 U.S.C. § 119 of Japanese Patent Application No. 2015-194500, filed on Sep. 30, 2015, the entire contents of which are hereby incorporated by reference.

BACKGROUND

1. Field

The present disclosure relates to a method of manufacturing a semiconductor device.

2. Description of the Related Art

As a light source of a next-generation exposure technique for miniaturizing a pattern of a semiconductor device, EUV (Extreme Ultra-Violet) using a wavelength of 13.5 nm or a very short wavelength is taken into consideration. However, since the EUV lacks in luminance power, the EUV is not still applied to a mass production of semiconductor devices.

In order to miniaturize a pattern through the existing immersion lithography using ArF excimer laser having a wavelength of 193 nm as a light source, SADP (Self-Aligned Double Patterning) is used. FIGS. 8A through 8C are diagrams schematically illustrating an example in which a line and space is formed through SADP. According to the SADP as illustrated in FIG. 8A, a mask 1140 made of photoresist and the like is formed on a wafer 200, and the surface of the wafer 200 having the mask 1140 formed thereon is then coated with a coating material 1150. Although the coating material 1150 is removed through an etching process, the coating material 1150 remains on the sidewalls of the mask 1140 as illustrated in FIG. 8B. When the mask 1140 is removed through a cleaning process as illustrated in FIG. 8C, a sidewall spacer (SWS) 1160 smaller than the mask 1140 is formed on the wafer 200.

When photoresist was used while the mask 1140 was formed, the SWS 1160 needs to be formed at low temperature. The pattern which can be obtained by forming the SWS 1160 is bent by the stress of a film.

RELATED ART DOCUMENT

Patent Document

[Patent Document 1] Japanese Patent Publication No. 2008-0085612

In order to prevent the pattern from being bent by the stress of the film, the stress of the SWS film needs to be controlled to a desired value or a material having no stress needs to be used.

Recently, much attention has been paid to $TiO_2$ as a material with which the wafer 200 can be coated at a relatively low temperature of not more than 100° C. However, the $TiO_2$ layer formed on the wafer 200 has a problem in that it has large stress and roughness.

Patent Document 1 discloses a technique for reinforcing a SWS 1900 using a hard mask 1620 as well as $TiO_2$ as illustrated in FIG. 9A, the hard mask 1620 including an amorphous silicon layer 1612 and a silicon oxide layer 1614. According to Patent Document 1, the hard mask 1620 and a second mask 1616 constituted by photoresist are formed on the wafer 200, and a mask 1211 is then formed on the hard mask 1620. The hard mask 1620 and the mask 1211 are coated with a coating material such as $TiO_2$. As illustrated in FIG. 9B, the coating material 1610, the hard mask 1620 and the second mask 1616 are removed until the surface of the wafer 200 is exposed. Then, the SWS 1900 is formed.

As the second mask 1616 and the hard mask 1620 are formed as illustrated in FIG. 9B, the upper end of the SWS 1900 may be positioned at a higher level than the upper end of the SWS 1160 of FIG. 8C. The greater height a SWS has, the SWS can be formed with a more minute structure.

In the technique disclosed in Patent Document 1, however, the coating material 1610 must be formed of $TiO_2$, and the layers such as the second mask 1616 and the hard mask 1620 must be formed of a material different from $TiO_2$. Thus, the step of forming the SWS 1900 becomes complex.

SUMMARY

Described herein is a technique for forming a film having a desired stress on a substrate during a manufacturing process of a semiconductor device or a substrate processing process.

According to one aspect described herein, there is provided a method of manufacturing a semiconductor device, including: forming a film having a predetermined stress on a substrate by controlling a ratio of a thickness of a first film having compressive stress to a thickness of a second film having tensile stress by performing: (a) supplying an organic source gas containing a first element and a reactive gas containing a second element to the substrate to form the first film containing the first element and the second element; and (b) supplying an inorganic source gas containing the first element and the reactive gas to the substrate to form the second film containing the first element and the second element.

According to the technique described herein, a film having a desired stress can be formed on the substrate.

DETAILED DESCRIPTION OF THE PREFERRED EMBODIMENTS

As long as the stress of a SWS film can be lowered to a desired value, a layer made of a material different from $TiO_2$ does not need to be formed on the wafer 200, unlike the technique described in Patent Document 1. The technique for lowering the stress of a SWS film to a desired value will be described in detail later.

<Configuration of Substrate Processing Apparatus Used in First Embodiment Described Herein>

Figure 1:
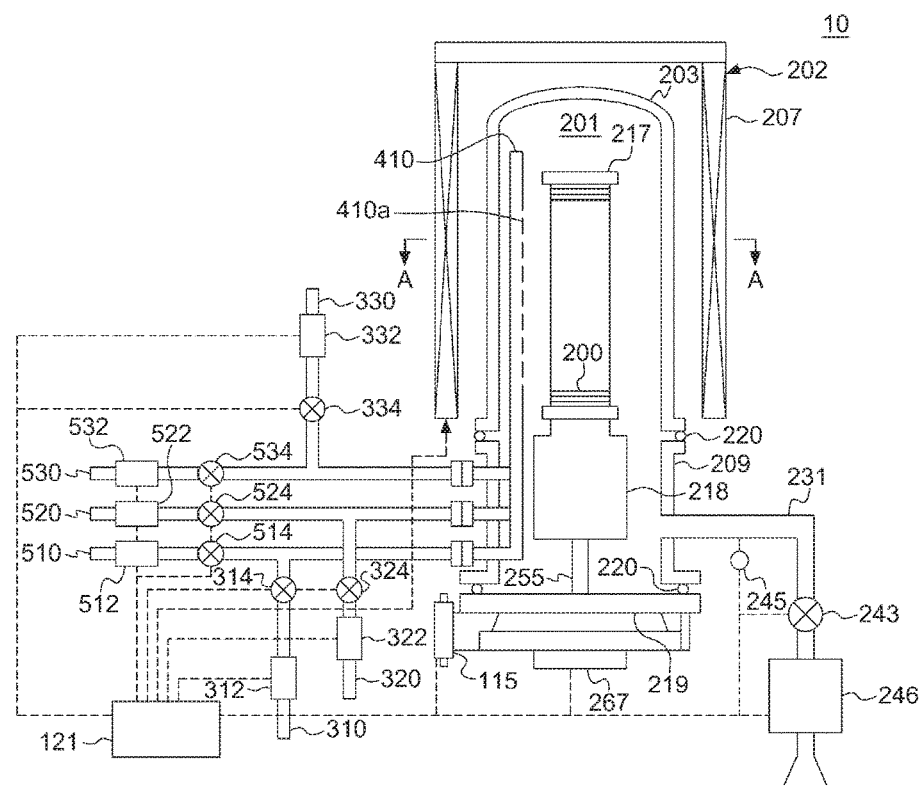
FIG. 1 is a diagram schematically illustrating a process furnace of a substrate processing apparatus which is preferably used in a first embodiment described herein, showing a longitudinal cross-section of the process furnace.
Figure 2:
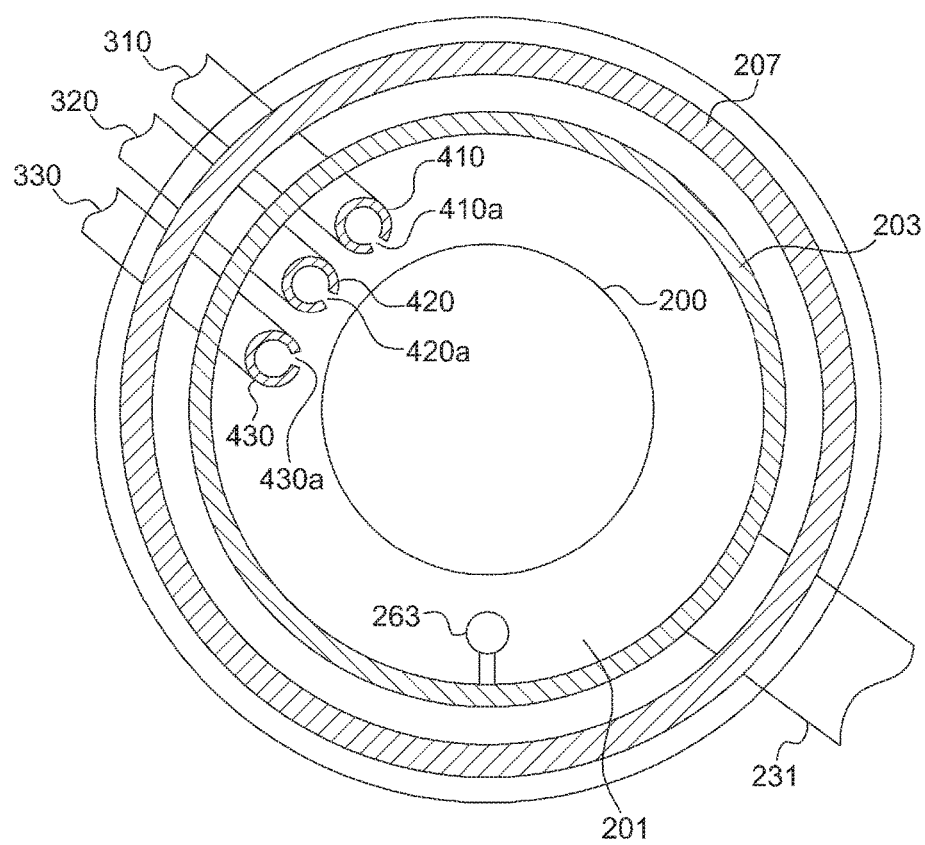
FIG. 2 is a cross-sectional view taken along the line A-A of FIG. 1.

Hereafter, a first embodiment will be described with reference to FIGS. 1 and 2. FIG. 1 is a diagram schematically illustrating a process furnace 202 of a substrate processing apparatus 10 which is preferably used in the first embodiment and other embodiments described herein, illustrating a longitudinal cross-section of the process furnace 202. FIG. 2 is a cross-sectional view taken along the line A-A of FIG. 1. The substrate processing apparatus 10 is one example of apparatuses which are used in a substrate processing step corresponding to one of processes of manufacturing a semiconductor device.

(1) Configuration of Process Furnace

The substrate processing apparatus 10 includes a process furnace 202. The process furnace 202 has a heater 207 installed therein, the heater 207 serving as a heating unit (heating device or heating system). The heater 207 is cylindrical with a closed upper end.

A reaction tube 203 constituting a reaction container (process container) is installed in the heater 207 so as to be concentric with the heater 207. The reaction tube 203 is formed of a heat-resisting material such as quartz ($SiO_2$) and carbon silicon (SiC), and is cylindrical with a closed upper end and an open lower end. A manifold (inlet flange) 209 is installed under the reaction tube 203 so as to be concentric with the reaction tube 203. The manifold 209 is formed of a metal such as stainless steel (SUS), and is cylindrical with open upper and lower ends. As the upper end of the manifold 209 is fitted to the lower end of the reaction tube 203, the manifold 209 supports the reaction tube 203. An O-ring 220 serving as a seal member is installed between the manifold 209 and the reaction tube 203. The manifold 209 is supported by a heater base (not illustrated), such that the reaction tube 203 is vertically installed. The process container (reaction container) is constituted mainly by the reaction tube 203 and the manifold 209. The process chamber 201 is defined by a hollow inner portion of the process container.

The process chamber 201 may house a plurality of wafers 200 serving as substrates, which are horizontally positioned and vertically stacked by a boat 217 described later.

Nozzles 410 through 430 are installed to penetrate the sidewall of the manifold 209 in the process chamber 201. Gas supply pipes 510 through 530 serving as gas supply lines are connected to the respective nozzles 410 through 430. The three nozzles 410 through 430 installed in the reaction tube 203 and the three gas supply pipes 510 through 530 may supply a plurality of gases into the process chamber 201. However, the process furnace 202 used in the first embodiment described herein and other embodiments is not limited to the above-described configuration.

As described above, the nozzles 410 through 430 are installed to penetrate the sidewall of the manifold 209 in the process chamber 201. The gas supply pipes 310 through 330 serving as gas supply lines are connected to the respective nozzles 410 through 430. The three nozzles 410 through 430 installed in the reaction tube 203 and the three gas supply pipes 310 through 330 may supply a plurality of gases into the process chamber 201. In the example of FIG. 1, the three nozzles 410 through 430 and the three gas supply pipes 310 through 330 can supply three types of gases (process gas and source gas). However, the process furnace 202 used in the first embodiment described herein and other embodiments is not limited to the above-described configuration.

Mass flow controllers (MFCs) 312 through 332 serving as flow rate controllers (flow rate control units) and valves 314 through 334 serving as opening/closing valves are sequentially installed at the gas supply pipes 310 through 330 from the upstream side toward the downstream side of the gas supply pipes 310 through 330, respectively. The nozzles 410 through 430 are connected to the front ends of the gas supply pipes 310 through 330. Each of the nozzles 410 through 430 is an L-shaped long nozzle, and has a horizontal portion penetrating the sidewall of the manifold 209. The vertical portions of the nozzles 410 through 430 are installed in an annular space formed between the inner wall of the reaction tube 203 and the wafer 200. Specifically, the vertical portions of the nozzles 410 through 430 are vertically installed from the lower portion toward the upper portion along the inner wall of the reaction tube 203 [along the stacking direction of the wafers 200], or vertically installed from one end toward the other end of the wafer arrangement region. That is, the nozzles 410 through 430 are vertically installed in a region which horizontally surrounds the wafer arrangement region at the side of the wafer arrangement region having the wafer 200 arranged therein, along the wafer arrangement region.

The nozzles 410 through 430 have gas supply holes 410a through 430a for supplying (spraying) gases, the gas supply holes 410a through 430a being installed at side surfaces of the nozzles 410 through 430. The gas supply holes 410a through 430a are open toward the center of the reaction tube 203. The gas supply holes 410a through 430a are installed across the reaction tube 203 from the lower portion to the upper portion of the reaction tube 203, and have the same opening area and pitch. However, the gas supply holes 410a through 430a are not limited to the above-described structure. For example, the opening areas of the gas supply holes 410a through 430a may increase from the lower portion toward the upper portion of the reaction tube 203. Thus, the flow rates of gases supplied through the gas supply holes 410a through 430a can be uniformized.

According to a gas supply method which is performed in the embodiments described herein, gases are supplied through the nozzles 410 through 430 which are arranged in a vertically long annular space defined by the inner wall of the reaction tube 230 and the end portions of the stacked wafers 200, that is, a cylindrical space, and initially sprayed into the reaction tube 203 around the wafers 200 through the gas supply holes 410a through 430a installed at the respective nozzles 410 through 430. Therefore, in the reaction tube 203, the gases mainly flow in a direction parallel to the surface of the wafer 200, that is, a horizontal direction. Thus, the gases can be uniformly supplied to the respective wafers 200, and the thicknesses of thin films formed on the respective wafers 200 can be uniformized. A gas on the surface of the wafer, that is, a gas remaining after a reaction (residual gas) flows toward an exhaust port, that is, an exhaust pipe 231 described later. However, the flow direction of the residual gas is properly specified by the position of the exhaust port, and not limited to the vertical direction.

Gas supply pipes 510 through 530 for supplying a carrier gas are connected to the respective gas supply pipes 310 through 330. The gas supply pipes 510 through 530 include MFCs 512 through 523 and valves 514 through 534 installed thereon.

For example, a first source gas (first metal containing gas) containing a metal element is supplied as a process gas into the process chamber 201 through the MFC 312 and the valve 314 which are installed at the gas supply pipe 310 and the nozzle 410. The first source is a metallic material which contains titanium (Ti) as a metal element and is free of carbon (C), that is, an inorganic metal source (inorganic metal compound). As the first source, titanium tetrachloride (TiCl$_4$) is used. TiCl$_4$ is a halogen-based source which is also referred to as a halogen compound or halogen-based titanium material. Ti is a transition metal element. The halogen-based source is a material containing a halogen group. The halogen group includes a chloro group, a fluorine group, a bromine group, an iodine group and the like. That is, halogen elements such as chlorine (Cl), fluorine (F), bromine (Br) and iodine (I) are included in the halogen group.

A second source gas (second metal containing gas) containing a metal element is supplied as a process gas into the process chamber 201 through the MFC 322 and the valve 324 which are installed at the gas supply pipe 320 and the nozzle 420. The second source may include a metal source containing Ti and C as metal elements, for example, tetraisopropoxy titanium (Ti[OCH(CH$_3$)$_2$]$_4$, abbreviated to TIPT) which is an organic source. The organic source is also referred to as an organic metal compound or organic titanium source.

An oxygen-containing gas which is a process gas containing oxygen (O) is supplied into the process chamber 201 through the MFC 333 and the valve 334 which are installed at the gas supply pipe 330 and the nozzle 430. Furthermore, an oxygen-containing gas free of a metal element, such as ozone (O$_3$) gas, may be used as the process gas.

An inert gas such as nitrogen (N$_2$) gas is supplied into the process chamber 201 through the MFCs 512 through 532 and the valves 514 through 534 which are installed at the gas supply pipes 510 through 530 and the nozzles 410 through 430.

In this specification, "source gas" indicates a gaseous source, for example, a gas which can be obtained by vaporizing or sublimating a liquid or solid source or a source which is in a gaseous state under normal temperature and pressure. Furthermore, "source" indicates "liquid source", "solid source", "source gas" or combinations thereof. When a liquid source which is in a liquid state under normal temperature and pressure, such as TiCl$_4$ and the like, is used, the liquid source is vaporized or sublimated by a system such as a bubbler and sublimation device, and then supplied as a source gas (TiCl$_4$ gas and the like).

When the above-described process gas is supplied through the gas supply pipes 310 through 330, a process gas supply system is constituted by the gas supply pipes 310 through 330, the MFCs 312 through 332 and the valves 314 through 334. The process gas supply system may further include the nozzles 410 through 430. The process gas supply system may be simply referred to as a gas supply system.

When a metal containing gas is supplied as the above-described source gas through the gas supply pipes 310 and 320, a metal containing gas supply system serving as a source gas supply system is constituted by the gas supply pipes 310 and 320, the MFCs 312 and 322 and the valves 314 and 324. The source gas supply system may further include the nozzles 410 and 420. The source gas supply system may be simply referred to as a source supply system.

When a halogen-based source gas is supplied as a source gas through the gas supply pipe 310, a halogen-based source gas supply system is constituted by the gas supply pipe 310, the MFC 312 and the valve 314. The halogen-based source gas supply system may further include the nozzle 410. The halogen-based source gas supply system may be simply referred to as a halogen-based source supply system. When TiCl$_4$ gas is supplied through the gas supply pipe 310, the halogen-based source gas supply system may be referred to as a TiCl$_4$ gas supply system. The TiCl$_4$ gas supply system may be simply referred to as a TiCl$_4$ supply system.

When an organic source gas is supplied as a source gas through the gas supply pipe 320, an organic source gas supply system is constituted by the gas supply pipe 320, the MFC 322 and the valve 324. The organic source gas supply system may further include the nozzle 420. The organic source gas supply system may be simply referred to as an organic source supply system. When TIPT gas is supplied through the gas supply pipe 320, the organic source gas supply system may be referred to as a TIPT gas supply system. The TIPT gas supply system may be simply referred to as a TIPT supply system.

When an oxygen-containing gas is supplied as a process gas through the gas supply pipe 330, an oxygen-containing gas supply system as a reactive gas supply system is constituted by the gas supply pipe 330, the MFC 332 and the valve 334. The oxygen-containing gas supply system may further include the nozzle 430. When O$_3$ gas is supplied through the gas supply pipe 330, the oxygen-containing gas supply system may be referred to as an O$_3$ gas supply system.

A carrier gas supply system is constituted by the gas supply pipes 510 through 530, the MFCs 512 through 523 and the valves 514 through 534. When an inert gas is supplied as the carrier gas, the carrier gas supply system may be referred to as an inert gas supply system. The inert gas may serve as a purge gas. Thus, the inert gas supply system may be referred to as a purge gas supply system.

The exhaust pipe 231 for exhausting the inner atmosphere of the process chamber 201 is installed at the manifold 209. The exhaust pipe 231 is installed to penetrate the sidewall of the manifold 209, similar to the nozzles 410 through 430. As illustrated in FIG. 2, the exhaust pipe 231 is installed at a position facing the nozzles 410 through 430 with the wafer 200 interposed therebetween, when seen from the top. Therefore, the gas supplied to around the wafer 200 in the process chamber 201 through the gas supply holes 410a through 430a flows along the horizontal direction, that is, the direction parallel to the surface of the wafer 200, and then flows downward in the vertical direction so as to be exhausted through the exhaust pipe 231. The main flow direction of the gas in the process chamber 201 is the horizontal direction as described above.

From the upstream side toward the downstream side of the exhaust pipe 231, a pressure sensor 245, an APC (Automatic Pressure Controller) valve 243 and a vacuum pump 246 are sequentially connected to the exhaust pipe 231. The pressure sensor 245 is a pressure detector for detecting an inner pressure of the process chamber 201, and the vacuum pump 246 is a vacuum exhaust device. The APC valve 243 is an exhaust valve and serves as a pressure adjusting unit. Furthermore, a trap device for capturing by-products or unreacted source gas in an exhaust gas or a detoxifying device for detoxifying corrosive substances or toxic substances contained in an exhaust gas may be connected to the exhaust pipe 231. The exhaust system (exhaust line) is constituted mainly by the exhaust pipe 231, the APC valve 243 and the pressure sensor 245. The exhaust system may further include the vacuum pump 246. The exhaust system may further include the trap device or detoxifying device.

A temperature sensor 263 serving as a temperature detector is installed in the reaction tube 203. Based on temperature information detected by the temperature sensor 263, the amount of power supplied to the heater 207 may be adjusted such that the inside of the process chamber 201 has a desired temperature distribution. The temperature sensor 263 is L-shaped like the nozzles 410 through 430, and installed along the inner wall of the reaction tube 203.

Figure 3:
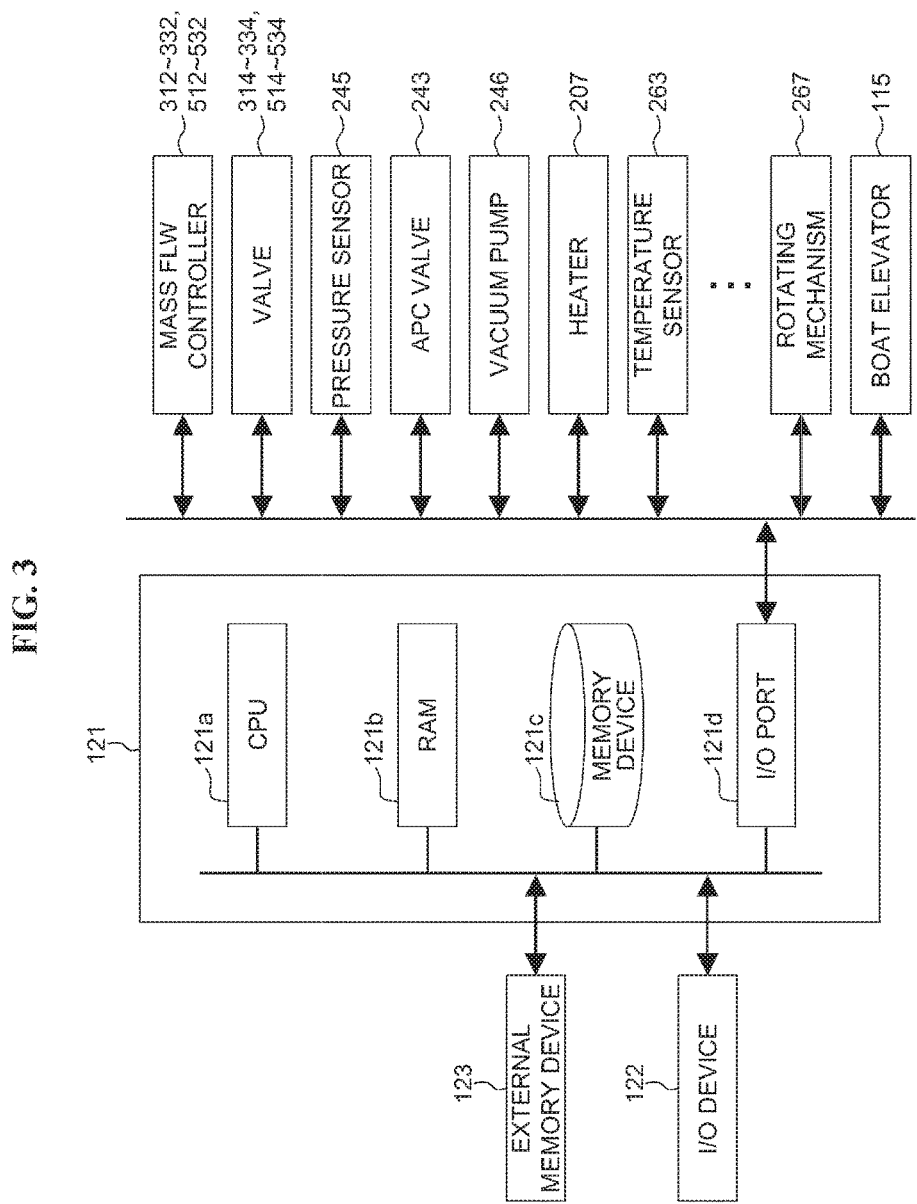
FIG. 3 is a block diagram illustrating a controller included in the substrate processing apparatus of FIG. 1.

FIG. 3 is a block diagram illustrating a controller 121 included in the substrate processing apparatus 10 of FIG. 1. As illustrated in FIG. 3, the controller 121 serving as a control unit is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus. The controller 121 is connected to an I/O device 122 such as a touch panel, for example.

The memory device 121c is embodied by a flash memory or HDD (Hard Disk Drive), for example. The memory device 121c readably stores a control program for controlling the operation of the substrate processing apparatus or a process recipe describing the sequence or condition of a substrate processing step described later. The process recipe includes steps of the substrate processing step described later, which are combined to acquire a predetermined result through the controller 121, and functions as a program. Hereafter, the process recipe or control program is collectively referred to as a program. In this specification, the term 'program' may indicate only a program recipe, indicate only a control program, or indicate both of the program recipe and the control program. The RAM 121b functions as a work area in which a program or data read by the CPU 121a is temporarily stored.

The I/O port 121d is connected to the components of the substrate processing apparatus 10, such as the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, a rotating mechanism 267 and a boat elevator 115.

The CPU 121a reads a control program from the memory device 121c and executes the control program. Furthermore, the CPU 121a reads a process recipe from the memory device 121c in response to an input of operation command from the I/O device 122. According to the read process recipe, the CPU 121a may control flow rate adjusting operations for various gases by the MFCs 312, 322, 332, 512, 522 and 532, opening/closing operations of the valves 314, 324, 334, 514, 524 and 534, an opening/closing operation of the APC valve 243, a pressure adjusting operation based on the pressure sensor 245 by the APC valve 243, a temperature adjusting operation of the heater 207 based on the temperature sensor 263, activation and suspension of the vacuum pump 246, a rotation and rotation speed adjusting operation for the boat 217 by the rotating mechanism 267, and a lifting/lowering operation for the boat 217 by the boat elevator 115.

The controller 121 may be embodied by installing the above-described program stored in an external memory device 123 into a computer. The external memory device 123 may include a magnetic disk such as a magnetic tape, flexible disk and hard disk, an optical disk such as CD and DVD, a magneto-optical disk such as MO, and a semiconductor memory such as a USB flash drive and memory card. The memory device 121c and the external memory device 123 may be embodied by transitory computer readable recording media. Hereafter, they are collectively referred to as recording media. In this specification, the term 'recording media' may indicate only the memory device 121c, indicate only the external memory device 123, or indicate both of the memory device 121c and the external memory device 123. As a unit for providing a program to a computer, a communication unit such as the Internet and a dedicated line as well as the external memory device 123 may be used.

(2) Substrate Processing Step (Film Forming Step)

A step of forming a $TiO_2$ film on a substrate is exemplified as one of the processes of manufacturing a semiconductor device. The step of forming a $TiO_2$ film is performed through the process furnace 202 of the above-described substrate processing apparatus 10. In the following descriptions, the respective units constituting the substrate processing apparatus 10 are controlled by the controller 121.

A method of forming a $TiO_2$ film on the substrate using an organic source gas such as TIPT and a halogen-based source gas such as $TiCl_4$ may be performed as follows. After an organic $TiO_2$ film is formed by performing a step of supplying TIPT as an organic source gas and a step of supplying $O_3$ as an oxygen-containing gas a predetermined number of times, an inorganic $TiO_2$ film is then formed by performing a step of supplying $TiCl_4$ as a halogen-based source gas and a step of supplying $O_3$ as an oxygen-containing gas a predetermined number of times. According to this method, the inorganic $TiO_2$ film is laminated on the organic $TiO_2$ film, thereby forming a resultant $TiO_2$ film.

Moreover, after the inorganic $TiO_2$ film is formed by performing the step of supplying $TiCl_4$ as a halogen-based source gas and the step of supplying $O_3$ as an oxygen-containing gas a predetermined number of times, the organic $TiO_2$ film may be then formed by performing the step of supplying TIPT as an organic source gas and the step of supplying $O_3$ as an oxygen-containing gas a predetermined number of times. According to this method, the organic $TiO_2$ film is laminated on the inorganic $TiO_2$ film, thereby forming a resultant $TiO_2$ film.

Furthermore, a $TiO_2$ film may be formed by performing a plurality of cycles each including a step of supplying TIPT as an organic source gas, a step of supplying $O_3$ as an oxygen-containing gas, a step of supplying $TiCl_4$ as a halogen-based source gas and a step of supplying $O_3$ as an oxygen-containing gas. As a result, an organic-inorganic mixed $TiO_2$ film is formed, in which the organic $TiO_2$ films and the inorganic $TiO_2$ films are laminated. Furthermore, instead of supplying the halogen-based source gas after supplying the organic source gas, the organic source gas may be supplied after the halogen-based source gas is supplied. The top layer of the organic-inorganic mixed $TiO_2$ film is an organic $TiO_2$ film when the finally supplied source gas is the organic source gas, and an inorganic $TiO_2$ film when the finally supplied source gas is the halogen-based source gas.

Alternatively, a $TiO_2$ film may be formed by performing a plurality of cycles each including a step of forming an organic $TiO_2$ film by repeating a step of supplying TIPT as an organic source gas and a step of supplying $O_3$ as an oxygen-containing gas a plurality of times and a step of forming an inorganic $TiO_2$ film by repeating a step of supplying $TiCl_4$ as a halogen-based source gas and a step of supplying $O_3$ as an oxygen-containing gas a plurality of times. As a result, an organic-inorganic mixed $TiO_2$ film is formed, in which the organic $TiO_2$ films and the inorganic $TiO_2$ films are laminated. According to this method, the organic $TiO_2$ film and the inorganic $TiO_2$ film have a larger thickness than in the above-described method which performs each step once during one cycle.

In the method of forming the organic-inorganic mixed $TiO_2$ film in which the organic $TiO_2$ films and the inorganic $TiO_2$ films are laminated, when the film forming process is competed by forming an inorganic $TiO_2$ film after forming an inorganic $TiO_2$ film, the inorganic $TiO_2$ film is the top layer. On the other hand, when the film forming process is completed by forming an organic $TiO_2$ film after forming an inorganic $TiO_2$ film, the organic $TiO_2$ film is the top layer.

The embodiments described herein aim to lower stress existing in a $TiO_2$ film to a desired value. In general, however, a thin film formed of $TiO_2$ has high stress. The stress σ (Pa) of the film may be expressed as Equation 1 below.

$$\sigma = \frac{E}{(1-v)} \cdot \frac{h^2}{6Rt} \quad \text{[Equation 1]}$$

In Equation 1, E/(1−v) represents a 2-axis elastic modulus (Pa) of the substrate, E represents Young's modulus, v represents Poisson's ratio, h represents the thickness (m) of the substrate, t represents the thickness (m) of the film, and R represents a change of bending, i.e. a radius of curvature (m).

In a laminated film including two kinds of films having different stresses, when the thickness of a first film having compressive stress is represented by $t_x$, the thickness of a second film having tensile stress is represented by $t_y$, the thickness of the laminated film is represented by $t_z$, the stress of the first film having compressive stress is represented by $\sigma_1$, the stress of the second film having tensile stress is represented by $\sigma_2$, and a desired stress of the laminated film is represented by $\sigma_3$, the relation of Equation 2 below is satisfied.

$$\begin{cases} t_x + t_y = t_z \\ \frac{\sigma_1}{t_x} - \frac{\sigma_2}{t_y} = \sigma_3 \end{cases} \quad \text{[Equation 2]}$$

When $a_1$ and $a_2$ represent integers different from each other, Equation 2 may be simplified as Equation 3 below.

$$a_1\sigma_1 + a_2\sigma_2 = \sigma_3 \quad \text{[Equation 3]}$$

The organic $TiO_2$ film formed through TIPT serving as an organic source gas has a compressive stress of −141 MPa per 100 nm, and the inorganic $TiO_2$ film formed through $TiCl_4$ serving as a halogen-based source gas has a tensile stress of 471 MPa per 100 nm.

In Equation 2, $t_x$ and $t_y$ are adjusted through methods according to embodiments described later, such that $\sigma_3$ is 0 when the thickness of the organic $TiO_2$ film is represented by $t_x$, the thickness of the inorganic $TiO_2$ film is represented by $t_y$, the thickness of the laminated film is $t_z$, the stress of the organic $TiO_2$ is $\sigma_1$, and the stress of the inorganic $TiO_2$ film is σ2.

The stress of the $TiO_2$ film may be affected by the stress of a base film formed under the $TiO_2$ film. For example, when both of the base film and the $TiO_2$ film have tensile stress, the $TiO_2$ film may relatively have compressive stress in case where the base film has larger stress. On the other hand, when both of the base film and the $TiO_2$ film have compressive stress, the $TiO_2$ film may relatively have tensile stress in case where the base film has larger stress. Thus, when the stress of the $TiO_2$ film is controlled, the stress of the base film may be preferably considered. For example, when both of the base film and the $TiO_2$ film have tensile stress, the tensile stress may be lowered by forming a $TiO_2$ film having smaller tensile stress than the base film. Furthermore, when both of the base film and the $TiO_2$ film have compressive stress, the compressive stress may be lowered by forming a $TiO_2$ film having smaller compressive stress than the base film.

First Embodiment

Figure 4:
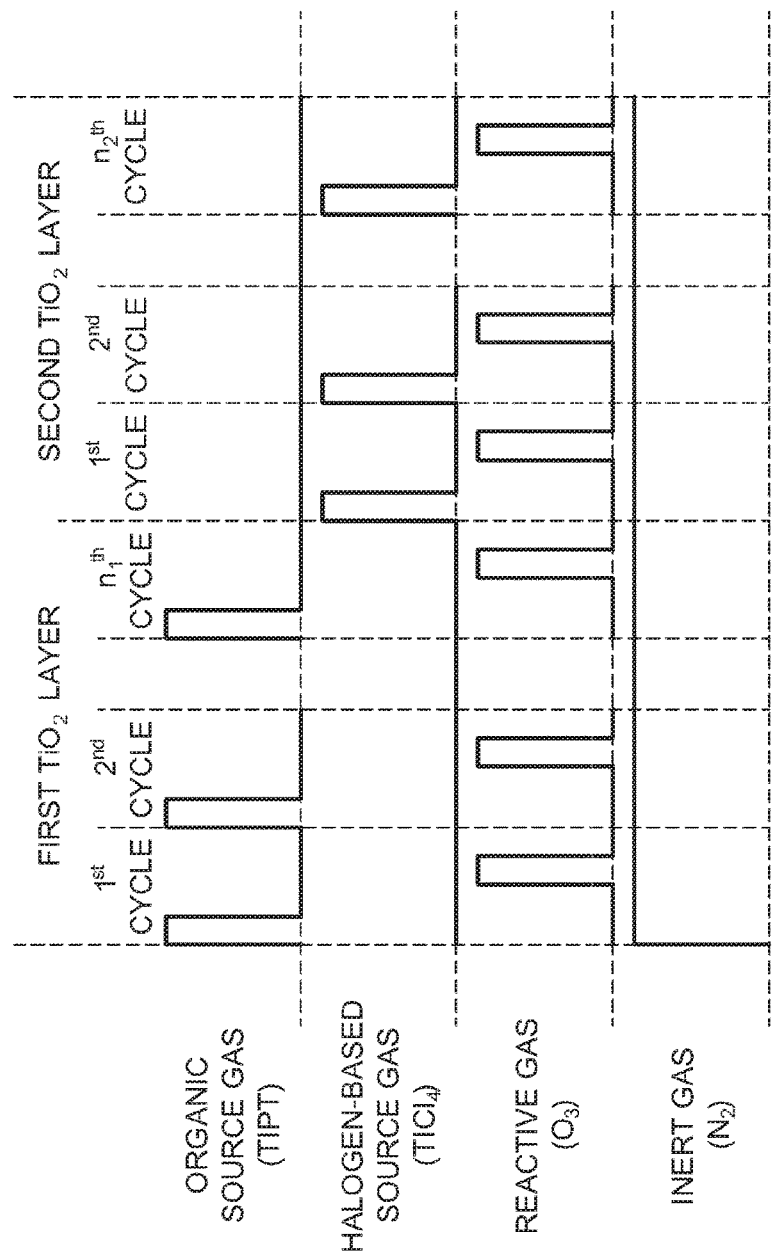
FIG. 4 is a diagram illustrating a sequence according to the first embodiment described herein.

As illustrated in FIG. 4, a film forming sequence according to a first embodiment described herein includes a step of forming a first layer (for example, $TiO_2$ layer) containing first and second elements on a wafer 200 by non-simultaneously performing: a step of supplying an organic source gas (for example, TIPT gas) containing a metal element (for example, Ti) as a first element onto the wafer 200; and a step of supplying a reactive gas (for example, $O_3$ gas) containing a second element [for example, oxygen (O)] and reacting with the first element onto the wafer 200; and a step of forming a second layer containing the first and second elements on the wafer 200 by non-simultaneously performing: a step of supplying a halogen-based source gas (for example, $TiCl_4$ gas) containing the first element onto the wafer 200; and a step of supplying the reactive gas onto the wafer 200, wherein the step of forming the first layer and the step of forming the second layer are performed a predetermined number of times.

In this specification, "wafer" indicates "a wafer itself", or indicates "a stacked body (aggregate) of the wafer and a predetermined film or layer formed on the wafer". That is, a wafer and a predetermined layer or film formed on the surface of the wafer may be collectively referred to as "wafer". In this specification, "surface of wafer" indicates "a surface (exposed surface) of the wafer" or "a surface of a predetermined layer or film formed on the wafer, i.e. the uppermost surface of the wafer as a stacked body".

Thus, in this specification, "supplying a predetermined gas onto a wafer" may indicate "directly supplying the predetermined gas onto the surface (exposed surface) of the wafer", or indicate "supplying the predetermined gas onto a layer or film formed on the wafer, i.e. the uppermost surface of the wafer as a stacked body". In this specification, "forming a predetermined layer or film on a wafer" may indicate "directly forming the predetermined layer or film on the surface (exposed surface) of the wafer", or indicate "forming the predetermined layer or film on a layer or film formed on the wafer, i.e. the uppermost surface of the wafer as a stacked body".

In this specification, "substrate" may indicate "wafer". In the above descriptions, "wafer" may be replaced with "substrate".

(Wafer Charging and Boat Loading Step)

When the boat 217 is charged with a plurality of wafers 200 (wafer charging), the boat 217 supporting the plurality of wafers 200 is lifted by the boat elevator 115, and loaded into the process chamber 201 (boat loading), as illustrated in FIG. 1. The seal cap 219 seals the opening of the lower end of the reaction tube 203 with an O-ring 220 interposed therebetween.

(Pressure and Temperature Adjusting Step)

The process chamber 201 is vacuum-exhausted by the vacuum pump 246 such that the inner pressure of the process chamber 201 becomes a desired pressure (degree of vacuum). At this time, the inner pressure of the process chamber 201 is measured through the pressure sensor 245, and the APC valve 243 is feedback-controlled based on the measured pressure information (pressure control). The vacuum pump 246 is continuously operated until at least the process for the wafer 200 is completed. The process chamber 201 is heated by the heater 207 such that the inner temperature of the process chamber 201 becomes a desired temperature. At this time, based on temperature information detected by the temperature sensor 263, the amount of power supplied to the heater 207 may be feedback-controlled such that the inside of the process chamber 201 has a desired temperature distribution (temperature control). The heater 207 continuously heats the process chamber 201 until at least the process for the wafer 200 is completed. The boat 217 and the wafer 200 are rotated by the rotating mechanism 267. The rotating mechanism 267 continuously rotates the boat 217 and the wafer 200 until at least the process for the wafer 200 is completed.

(First $TiO_2$ Film Forming Step)

Next, a step of forming a first $TiO_2$ film is performed. The first $TiO_2$ film forming step includes an organic source gas supply step, a residual gas removing step, an oxygen-containing gas supply step and a residual gas removing step, which are described later.

(Organic Source Gas Supply Step)

The valve 324 is opened to supply TIPT gas as an organic source gas into the gas supply pipe 320. The flow rate of TIPT gas supplied into the gas supply pipe 320 is adjusted by the MFC 322. The TIPT gas with the adjusted flow rate is supplied into the process chamber 201 through the gas supply hole 420a of the nozzle 420, and exhausted through the exhaust pipe 231. Thus, the TIPT gas is supplied onto the wafer 200. That is, the surface of the wafer 200 is exposed to the TIPT gas. While the TIPT gas is supplied as an organic source gas, the valve 524 is opened to supply $N_2$ gas into the gas supply pipe 520. The flow rate of $N_2$ gas supplied into the gas supply pipe 520 is adjusted by the MFC 522. The $N_2$ gas with the adjusted flow rate is supplied with the TIPT gas into the process chamber 201, and exhausted through the exhaust pipe 231. In order to prevent the TIPT gas from permeating into the nozzles 410 and 430, the valves 514 and 534 are opened to supply $N_2$ gas into the gas supply pipe 510 and the gas supply pipe 530. The $N_2$ gas is supplied into the process chamber 201 through the gas supply pipe 310, the gas supply pipe 330, the nozzle 410 and the nozzle 430, and exhausted through the exhaust pipe 231.

At this time, the APC valve 243 properly adjusts the inner pressure of the process chamber 201 to a predetermined value. The inner pressure of the process chamber 201 ranges from 1 Pa to 1,000 Pa, preferably ranges from 10 P to 200 Pa, or more preferably ranges from 100 Pa to 150 Pa. When the inner pressure of the process chamber 210 is higher than 1,000 Pa, a residual gas may not be sufficiently removed at the residual gas removing step described later. When the inner pressure of the process chamber 201 is lower than 1 Pa, a satisfactory reaction rate of the TIPT gas may be not obtained. In this specification, when "range of 1 Pa to 1,000 Pa" is described as a numerical range, the numerical range may include a value equal to or more than 1 P and a value equal to or less than 1,000 Pa. That is, the numerical range includes 1 Pa and 1,000 Pa. In addition to the pressure, the same condition is applied to all numerical values described in this specification, such as flow rate, time, temperature and the like.

The flow rate of supplied TIPT gas is controlled to a predetermined value by the MFC 322. The flow rate of the supplied TIPT gas ranges from 0.008 slm to 0.1 slm, preferably ranges from 0.016 slm to 0.1 slm, or more preferably ranges from 0.05 slm to 0.1 slm. When the flow rate of the supplied TIPT gas is higher than 0.1 slm, a residual gas may not be sufficiently removed at the residual gas removing step described later. When the flow rate of the supplied TIPT gas is smaller than 0.008 slm, a satisfactory reaction rate of the TIPT gas may not be obtained, and the flow rate may be difficult to control.

The flow rate of the supplied $N_2$ gas is controlled to a predetermined value by the MFCs 512, 522 and 532. The flow rate of the supplied $N_2$ gas ranges from 0.1 slm to 40 slm, preferably ranges from 1 slm to 40 slm, or more preferably ranges from 20 slm to 40 slm. When the flow rate of the supplied $N_2$ gas is higher than 40 slm, the inner pressure of the process chamber 201 may significantly rise, and a satisfactory reaction rate of the TIPT gas may not be obtained. When the flow rate of the supplied $N_2$ gas is lower than 0.1 slm, the inner pressure of the process chamber 201 may significantly fall, and a residual gas may not be sufficiently removed at the residual gas removing step described later.

The time duration during which the TIPT gas is supplied onto the wafer 200, that is, the gas supply time duration (irradiation time) is set to a predetermined time. The gas supply time duration ranges from 1 second to 60 seconds, preferably ranges from 10 seconds to 40 seconds, or more preferably ranges from 15 seconds to 30 seconds. When the gas supply time duration is longer than 60 seconds, impurities such as C, H and O may permeate into the $TiO_2$ film. When the gas supply time duration is shorter than 1 second, the film forming rate may be lowered, and the gas supply time duration may be difficult to control.

Figure 8A:
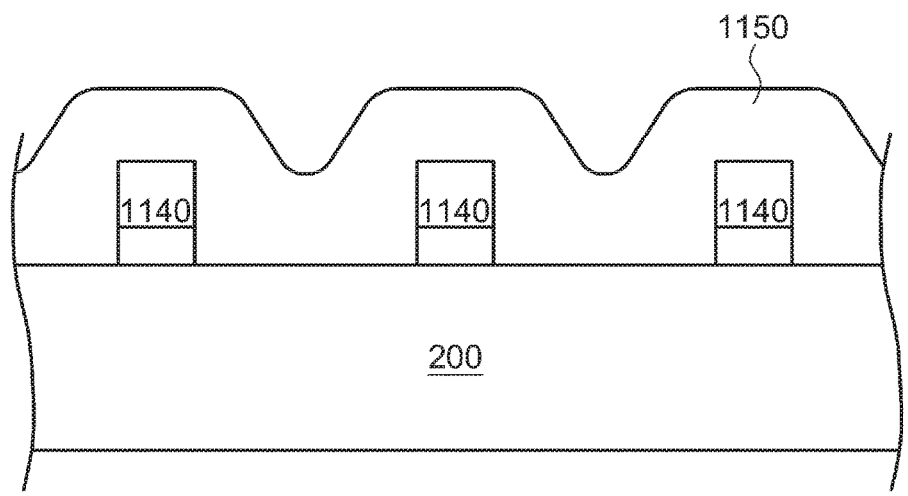
FIGS. 8A through 8C are diagrams schematically illustrating an example in which a line and space is formed through SADP.
Figure 8B:
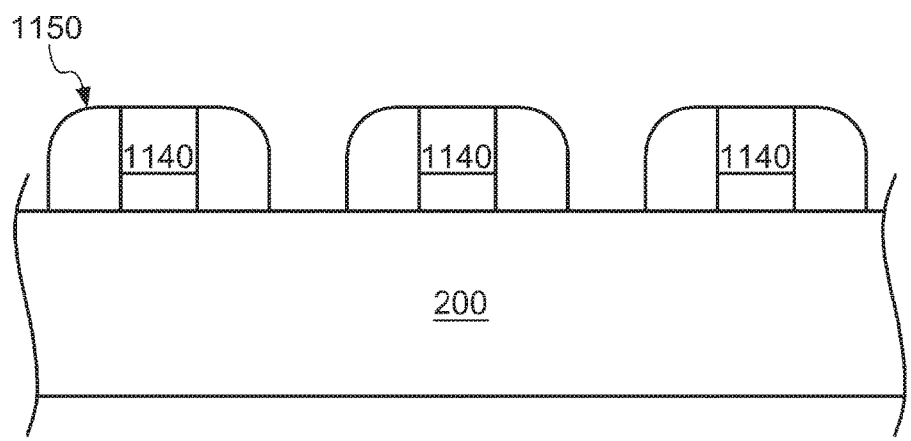
Figure 8C:
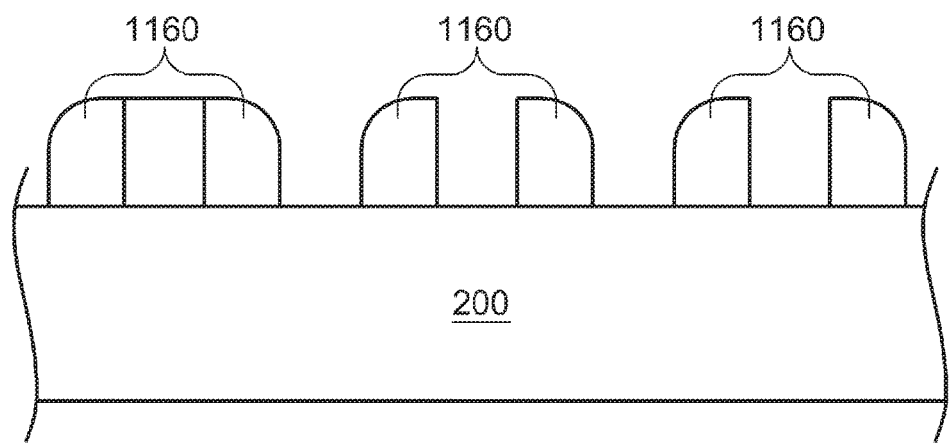
Figure 9A:
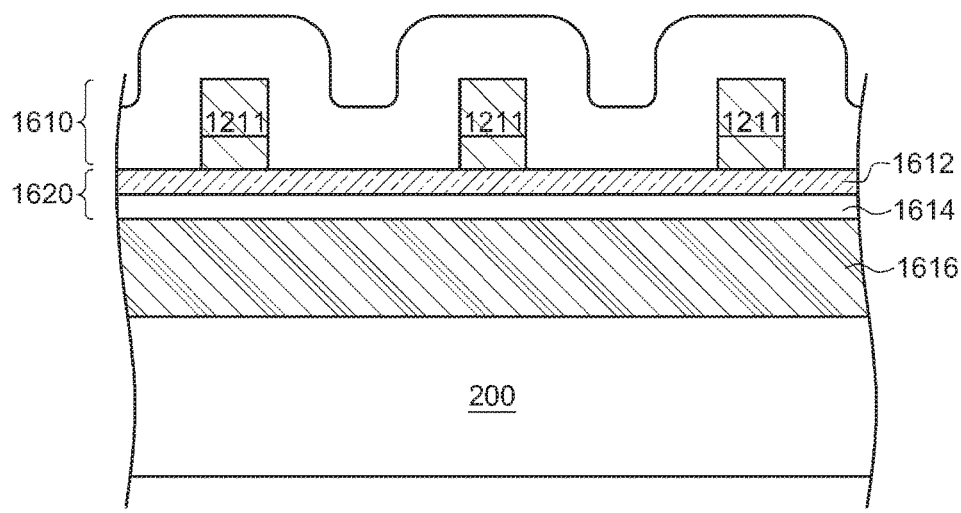
FIGS. 9A and 9B are diagrams schematically illustrating an example in which a line and space are formed according to SADP described in Patent Document 1.
Figure 9B:
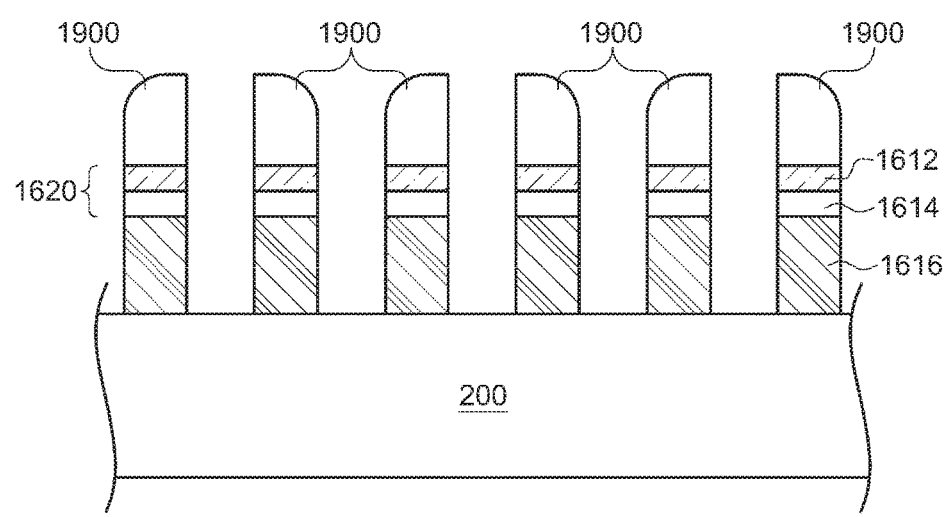

At this time, the temperature of the heater 207 is set to control the temperature of the wafer 200 to a predetermined temperature. The temperature of the wafer 200 ranges from 25° C. to 100° C., preferably ranges from 50° C. to 100° C., or more preferably ranges from 70° C. to 80° C. In this specification, since the $TiO_2$ film is formed on the wafer 200 coated with photoresist as illustrated in FIGS. 8A through 8C, the temperature of the wafer 200 during the film forming process may be set to not more than 100° C. which is lower than the dissolution temperature of the photoresist. In order to suppress liquefaction of TIPT gas, the temperature of the wafer 200 during the film forming process may be set to not less than 25° C. Only TIPT gas and $N_2$ gas are supplied into the process chamber 201, and a titanium-containing layer having a thickness ranging from one atomic layer to several atomic layers, for example, is formed on the wafer 200 (the base film on the surface) through the step of supplying TIPT gas.

The titanium-containing layer may not only include a single Ti atom, but also include other atoms from the respective sources. The titanium-containing layer formed through the organic source gas supply step using TIPT gas may include organic matters such as C, H and O and one-atom alcohol such as isopropanol. Therefore, the titanium-containing layer may be referred to as a TIPT layer which is an adsorption layer of TIPT.

(Residual Gas Removing Step)

Next, the valve 324 is closed to stop the supply of the TIPT gas. At this time, as the APC valve 243 of the exhaust pipe 231 is opened to vacuum exhaust the process chamber 201 through the vacuum pump 246, unreacted TIPT gas remaining in the process chamber 201 or the TIPT gas having contributed to forming the above-described titanium-containing layer is removed from the process chamber 201. At this time, the valves 514 through 534 are opened to continuously supply $N_2$ gas into the process chamber 201. The $N_2$ gas serves as a purge gas. Through the step of continuously supplying $N_2$ gas, unreacted TIPT gas remaining in the process chamber or the TIPT gas having contributed to forming the above-described titanium-containing layer may be more effectively removed from the process chamber 201.

At this time, the gas remaining in the process chamber 201 may not completely removed, and the inside of the process chamber 201 may not completely purged. When a very small amount of gas remains in the process chamber 201, almost no adverse effects occur at the following steps. The flow rate of $N_2$ gas supplied into the process chamber 201 does not need to be high. For example, through a step of supplying the same amount of $N_2$ gas as the volume of the reaction tube 203 (process chamber 201), a purge operation may be performed to such an extent that almost no adverse effects occur at the following steps. As the process chamber 201 is not completely purged, the purge time duration can be shortened to improve the manufacturing throughput. The consumption of $N_2$ gas can be controlled to a minimum value.

(Oxygen-Containing Gas Supply Step)

After the residual gas in the process chamber 201 is removed, the valve 334 is opened to supply $O_3$ gas as an oxygen-containing gas into the gas supply pipe 330. The flow rate of $O_3$ gas supplied into the gas supply pipe 330 is adjusted by the MFC 332. The $O_3$ gas with the adjusted flow rate is supplied into the process chamber 201 through the gas supply hole 430a of the nozzle 430. The $O_3$ gas supplied into the process chamber 201 is thermally activated, and then exhausted through the exhaust pipe 231. At this time, the thermally activated $O_3$ gas is supplied onto the wafer 200. That is, the surface of the wafer 200 is exposed to the thermally activated $O_3$ gas. By opening the valve 534 while supplying the oxygen-containing gas, $N_2$ gas is supplied into the gas supply pipe 530. The flow rate of $N_2$ gas supplied into the gas supply pipe 530 is adjusted by the MFC 532. The $N_2$ gas is supplied with the $O_3$ gas into the process chamber 201, and exhausted through the exhaust pipe 231. At this time, in order to prevent $O_3$ gas from permeating into the nozzles 410 and 420, the valves 514 and 524 are opened to supply $N_2$ gas into the gas supply pipes 510 and 520. The $N_2$ gas is supplied into the process chamber 201 through the gas supply pipes 310 and 320 and the nozzles 410 and 420, and exhausted through the exhaust pipe 231.

When $O_3$ gas is supplied, the APC valve 243 is properly adjusted such that the inner pressure of the process chamber 201 becomes a predetermined value. The inner pressure of the process chamber 201 ranges from 1 Pa to 1,000 Pa, preferably ranges from 10 P to 300 Pa, or more preferably ranges from 100 Pa to 150 Pa. When the inner pressure of the process chamber 210 is higher than 1,000 Pa, a residual gas may not be sufficiently removed at the residual gas removing step described later. When the inner pressure of the process chamber 201 is lower than 1 Pa, a sufficient film forming rate may not be obtained.

The flow rate of the supplied $O_3$ gas is controlled to a predetermined value by the MFC 332. The flow rate of the supplied $O_3$ gas ranges from 1 slm to 80 slm, preferably ranges from 5 slm to 40 slm, or more preferably ranges from 10 slm to 30 slm. The higher the flow rate of the supplied $O_3$ gas, the permeation of impurities into the $TiO_2$ film can be reduced more effectively, the impurities being produced from the source gas. However, when the flow rate of the supplied $O_3$ gas is higher than 40 slm, a residual gas may not be sufficiently removed at the residual gas removing step described later.

The flow rate of the supplied $N_2$ gas is controlled by the MFCs 512, 522 and 532. The flow rate of the supplied $N_2$ gas ranges from 0.2 slm to 30 slm, preferably ranges from 1 slm to 40 slm, or more preferably ranges from 1 slm to 5 slm. When the flow rate of the supplied $N_2$ gas is higher than 30 slm, the inner pressure of the process chamber 201 may abnormally rise, and a satisfactory film forming rate may not be obtained. When the flow rate of the supplied $N_2$ gas is lower than 0.2 slm, the inner pressure of the process chamber 201 may abnormally fall, and a residual gas may not be sufficiently removed at the residual gas removing step.

The time duration during which the $O_3$ gas is supplied to the wafer 200, i.e. the gas supply time duration (irradiation time duration) is set to a predetermined time. The gas supply time duration (irradiation time duration) ranges from 1 second to 60 seconds, preferably ranges from 1 second to 30 seconds, or more preferably ranges from 5 seconds to 15 seconds. The longer the gas supply time duration, the permeation of impurities into the $TiO_2$ film can be reduced more effectively, the impurities being produced from the source gas. However, when the gas supply time duration is longer than 30 seconds, the throughput may be degraded, and when the gas supply time duration is shorter than 1 second, the film forming rate may be lowered, which makes it difficult to control the gas supply time duration. At this time, the temperature of the heater 207 is set to the same temperature as the organic source gas supply step.

At this time, only $O_3$ gas and $N_2$ gas are supplied into the process chamber 201. The $O_3$ gas is replaced with at least a part of the titanium-containing layer formed on the wafer 200 while reacting with the titanium-containing layer, at the organic source gas supply step. When the $O_3$ gas is replaced with at least a part of the titanium containing layer, Ti contained in the titanium-containing layer and O contained in the $O_3$ gas are coupled to form a $TiO_2$ layer containing Ti and O on the wafer 200.

(Residual Gas Removing Step)

After the $TiO_2$ layer is formed, the valve 334 is closed to stop the supply of the $O_3$ gas. At this time, the APC valve 243 of the exhaust pipe 231 is opened to vacuum exhaust the process chamber 201 through the vacuum pump 246. Then, unreacted $O_3$ gas remaining in the process chamber 201, the $O_3$ gas having contributed to forming the $TiO_2$ layer, or by-products may be removed from the process chamber 201. At this time, the valves 514 through 534 are opened to continuously supply $N_2$ gas into the process chamber 201. The N2 gas serves as a purge gas. Then, unreacted $O_3$ gas remaining in the process chamber 201, the $O_3$ gas having contributed to forming the $TiO_2$ layer, or by-products may be more effectively removed from the process chamber 201.

At this time, a gas remaining in the process chamber 201 may not completely removed, and the inside of the process chamber 201 may not completely purged, as in the residual gas removing step after the organic source gas supply step.

(Perform Predetermined Number of Times)

By performing a cycle one or more times (predetermined number of times), the cycle including the organic source gas supply step, the residual gas removing step, the oxygen-containing gas supply step and the residual gas supply step, which are sequentially and non-simultaneously performed, a $TiO_2$ film (first $TiO_2$ film) having a predetermined thickness of 0.05 nm to 100 nm is formed on the wafer 200. Specifically, the organic source gas supply step, the residual gas removing step, the oxygen-containing gas supply step and the residual gas supply step may be set to one cycle, and the cycle may be performed $n_1$ times where $n_1$ is an integer equal to or more than 1.

When the cycle is performed a plurality of times, "supplying a gas to the wafer 200" at the respective steps after at least the second cycle may indicate "supplying a predetermined gas to a layer formed on the wafer 200, that is, the uppermost surface of the wafer 200 as a stacked body", and "forming a predetermined layer on the wafer 200" may indicate "forming a predetermined layer on a layer formed on the wafer 200, that is, the uppermost surface of the wafer 200 as a stacked layer". This aspect is applied in the same manner to embodiments described later.

(Second $TiO_2$ Film Forming Step)

Next, a second $TiO_2$ film forming step is performed. The second $TiO_2$ film forming step includes a halogen-based source gas supply step, a residual gas removing step, an oxygen-containing gas supply step and a residual gas removing step, which are described later.

(Halogen-Based Source Gas Supply Step)

The valve 314 is opened to supply $TiCl_4$ gas as a halogen-based source gas into the gas supply pipe 310. The flow rate of $TiCl_4$ gas supplied into the gas supply pipe 310 is adjusted by the MFC 312. The $TiCl_4$ gas with the adjusted flow rate is supplied into the process chamber 201 through the gas supply hole 410a of the nozzle 410, and then exhausted through the exhaust pipe 231. Thus, the $TiCl_4$ gas is supplied onto the wafer 200. That is, the surface of the wafer 200 is exposed to the $TiCl_4$ gas. At this time, by opening the valve 514 while supplying the $TiCl_4$ gas, an inert gas such as $N_2$ gas is supplied into the gas supply pipe 510. The flow rate of the $N_2$ gas supplied into the gas supply pipe 510 is adjusted by the MFC 512. The $N_2$ gas with the adjusted flow rate is supplied with the $TiCl_4$ gas into the process chamber 201, and exhausted through the exhaust pipe 231. At this time, in order to prevent the $TiCl_4$ gas from permeating into the nozzles 420 and 430, the valves 524 and 534 are opened to supply $N_2$ gas into the gas supply pipes 520 and 530. The $N_2$ gas is supplied into the process chamber 201 through the gas supply pipe 320, the gas supply pipe 330, the nozzle 420 and the nozzle 430, and exhausted through the exhaust pipe 231.

At this time, the APC valve 243 is properly adjusted to set the inner pressure of the process chamber 201 to a predetermined value. The inner pressure of the process chamber 201 ranges from 1 Pa to 1,000 Pa, preferably ranges from 10 P to 100 Pa, or more preferably ranges from 20 Pa to 50 Pa, as in the above-described organic source gas supply step. When the inner pressure of the process chamber 210 is higher than 1,000 Pa, a residual gas may not be sufficiently removed at the residual gas removing step described later. When the inner pressure of the process chamber 201 is lower than 1 Pa, a satisfactory reaction rate of the TIPT gas cannot be obtained.

The flow rate of the supplied $TiCl_4$ gas is controlled to a predetermined value by the MFC 312. The flow rate of the supplied $TiCl_4$ gas ranges from 0.001 slm to 2 slm, preferably ranges from 0.002 slm to 1 slm, or more preferably ranges from 0.005 slm to 0.01 slm. When the flow rate of the supplied $TiCl_4$ gas is higher than 2 slm, a residual gas may not be sufficiently removed at the residual gas removing step described later. When the flow rate of the supplied $TiCl_4$ gas is lower than 0.001 slm, a satisfactory reaction rate of the $TiCl_4$ gas may not be obtained, and the flow rate of the $TiCl_4$ gas may be difficult to control.

The flow rate of the supplied $N_2$ gas is controlled to a predetermined value by the MFCs 512, 522 and 532. The flow rate of the supplied $N_2$ gas ranges from 0.2 slm to 30 slm, preferably ranges from 0.3 slm to 15 slm, or more preferably ranges from 0.4 slm to 0.6 slm. When the flow rate of the supplied $N_2$ gas is higher than 30 slm, the inner pressure of the process chamber 201 may abnormally rise, and a satisfactory reaction rate of the $TiCl_4$ gas may not be obtained. When the flow rate of the supplied $N_2$ gas is lower than 0.2 slm, the inner pressure of the process chamber 201 may abnormally fall, and a residual gas may not be sufficiently removed at the residual gas removing step described later.

The time duration during which the $TiCl_4$ gas is supplied to the wafer 200, i.e. the gas supply time duration (irradiation time duration) is set to a predetermined time. The gas supply time duration ranges from 1 second to 60 seconds, preferably ranges from 1 second to 30 seconds, or more preferably ranges from 3 seconds to 7 seconds. When the gas supply time duration is longer than 60 seconds, a large amount of impurity such as Cl may permeate into the $TiO_2$ film. When the gas supply time duration is shorter than 1 second, the film forming rate may be lowered, and the gas supply time duration may be difficult to control. At this time, the temperature of the heater 207 is set to the same temperature as the organic source gas supply step. Furthermore, only $TiCl_4$ gas and $N_2$ gas are supplied into the process chamber 201, and a titanium-containing layer having a thickness ranging from one atomic layer to several atomic layers, for example, is formed on the wafer 200 (on the base film of the surface or the first $TiO_2$ film) through the step of supplying $TiCl_4$ gas.

Similar to the titanium-containing layer formed at the organic source gas supply step, the titanium-containing layer formed at the halogen-based source gas supply step may not only include a single atom (Ti), but also include other atoms from the respective sources. That is, the titanium-containing layer may include Cl as a halogen-based element at the halogen-based source gas supply step. That is, the titanium-containing layer includes a $TiCl_4$ layer as an adsorption layer of $TiCl_4$.

(Residual Gas Removing Step)

After the titanium-containing layer is formed, the valve 314 is closed to stop the supply of the $TiCl_4$ gas. At this time, the APC valve 243 of the exhaust pipe 231 is opened to vacuum exhaust the process chamber 201 through the vacuum pump 246. Then, unreacted $TiCl_4$ gas remaining in the process chamber 201 or the $TiCl_4$ gas having contributed to forming the titanium-containing layer is removed from the process chamber 201. That is, the unreacted $TiCl_4$ gas remaining in the space where the wafer 200 having the titanium-containing layer formed thereon exist or the $TiCl_4$ gas having contributed to forming the titanium-containing layer is removed. At this time, the valves 514 through 534 are opened to continuously supply $N_2$ gas into the process chamber 201. The $N_2$ gas serves as a purge gas. Thus, unreacted $TiCl_4$ gas remaining in the process chamber 201 or the $TiCl_4$ gas having contributed to forming the titanium-containing layer can be more efficiently removed from the process chamber 201.

At this time, a gas remaining in the process chamber 201 may not completely removed, and the inside of the process chamber 201 may not completely purged, as in the residual gas removing step after the organic source gas supply step.

(Oxygen-Containing Gas Supply Step)

Next, $O_3$ gas is supplied as an oxygen-containing gas into the process chamber 201 according to the same process sequence and process condition as the oxygen-containing gas supply step. At this time, only $O_3$ gas and $N_2$ gas are supplied into the process chamber 201. The $O_3$ gas is replaced with at least a part of the titanium-containing layer formed on the wafer 200 while reacting with the titanium-containing layer, at the halogen-based source gas supply step. When the $O_3$ gas is replaced with at least a part of the titanium-containing layer, Ti contained in the titanium-containing layer and O contained in the $O_3$ gas are coupled to form a $TiO_2$ layer containing Ti and O on the wafer 200.

(Residual Gas Removing Step)

Next, through the same process as the residual gas removing step after the organic source gas supply step, unreacted $O_3$ gas remaining in the process chamber 201 or $O_3$ gas having contributed to forming the $TiO_2$ layer and by-products are removed from the process chamber 201.

By performing a cycle one or more times (predetermined number of times), the cycle including the halogen-based source gas supply step, the residual gas removing step, the oxygen-containing gas supply step and the residual gas removing step, which are sequentially and non-simultaneously performed, a $TiO_2$ film (second $TiO_2$ film) having a predetermined thickness of 0.1 nm to 10 nm is formed on the wafer 200. Specifically, the halogen-based source gas supply step, the residual gas removing step, the oxygen-containing gas supply step and the residual gas removing step may be set to one cycle, and the cycle may be performed $n_2$ times where $n_2$ is an integer equal to or more than 1. The above-described cycle may be repeated a plurality of times.

(Purge and Atmospheric Pressure Return Step)

The valves 514 through 534 are opened to supply $N_2$ gas into the process chamber 201 through the gas supply pipes 510 through 530, and the $N_2$ gas is exhausted from the exhaust pipe 231. The $N_2$ gas serves as a purge gas. Thus, the inside of the process chamber 201 is purged by the inert gas, and a gas or by-products remaining in the process chamber 201 are removed from the process chamber 201 (purge). Then, the inner atmosphere of the process chamber 201 is replaced with the inert gas (inert gas replacement), and the inner pressure of the process chamber 201 is returned to the normal pressure (atmospheric pressure return).

(Boat Unloading and Wafer Discharging)

Then, as the seal cap 219 is lowered by the boat elevator 115, the lower end of the reaction tube 203 is opened. With the processed wafer 200 supported by the boat 217, the wafer 200 is unloaded to the outside of the reaction tube 203 through the lower end of the reaction tube 203 (boat unloading). Then, the processed wafer 200 is discharged from the boat 217 (wafer discharging).

(3) Effects of First Embodiment

According to the first embodiment, one or more effects described below can be obtained.

According to the first embodiment, a laminated film constituted by an organic film having compressive stress and an inorganic film having tensile stress may be formed by controlling the ratio of the thickness of the organic film to the thickness of the inorganic film. Thus, the laminated film having a desired stress may be formed on the wafer 200. For example, in order to minimize the stress of the laminated film, the ratio of the thickness of the organic film to the thickness of the inorganic film is controlled such that the stress of the organic film having compressive stress is equal to the stress of the inorganic film having tensile stress. In order to obtain a laminated film having compressive stress, the ratio of the thickness of the organic film to the thickness of the inorganic film is controlled such that the absolute value of the stress of the organic film having compressive stress is larger than the absolute value of the stress of the inorganic film having tensile stress. In order to obtain a laminated film having tensile stress, the ratio of the thickness of the organic film to the thickness of the inorganic film is controlled such that the absolute value of the stress of the inorganic film having tensile stress is larger than the absolute value of the stress of the organic film having compressive stress. As the laminated film constituted by the first $TiO_2$ film as the organic $TiO_2$ film having compressive stress and the second $TiO_2$ film as the inorganic $TiO_2$ film is formed by controlling the ratio of the thickness of the first $TiO_2$ film to the thickness of the second $TiO_2$ film, the laminated film ($TiO_2$ film) having a desired stress may be formed on the wafer 200.

Since the laminated film constituted by the organic film and inorganic film can be homogenized more easily than a mixed film according to a third embodiment and a mixed film according to a fourth embodiment, the film can be uniformly removed.

Since the laminated film constituted by the first and second $TiO_2$ films can be homogenized more easily than the mixed film according to the third embodiment and the mixed film according to the fourth embodiment, the film can be uniformly removed by the etching process which has been described with reference to FIGS. 8A through 8C and 9A and 8B.

According to the first embodiment, the top layer of the laminated film is an inorganic film formed by the halogen-based source gas. When batch cleaning is performed, the inorganic film is of advantage to the batch cleaning because the inorganic film has a hydrophile property. The compatibility between the inorganic film having a hydrophile property and photoresist is better than the compatibility between the organic film and photoresist.

The above-described effects can be also obtained when another halogen-based source gas as well as $TiCl_4$ gas is used as a source gas, when another organic source gas as well as TIPT gas is used as a source gas, or when another oxygen-containing gas as well as $O_3$ gas is used as a reactive gas.

Second Embodiment

In the first embodiment, it has been described that the first $TiO_2$ film is formed by the TIPT gas serving as an organic source gas and the $O_3$ gas serving as an oxygen-containing gas, the second $TiO_2$ film is formed by the $TiCl_4$ gas serving as a halogen-based gas and the $O_3$ gas serving as an oxygen-containing gas, and the resultant $TiO_2$ film is formed. In a second embodiment, the detailed descriptions of the same portions as those of the first embodiment are omitted, and different portions from those of the first embodiment will be described.

Figure 5:
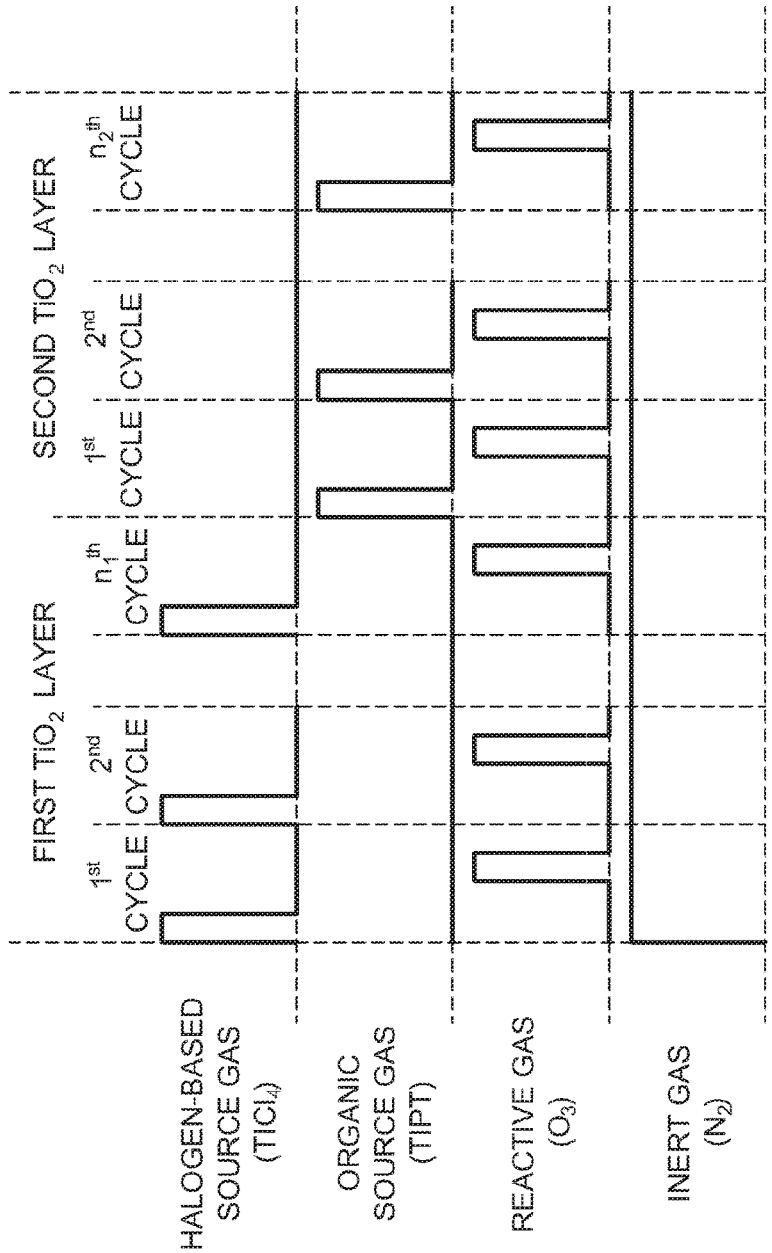
FIG. 5 is a diagram illustrating a sequence according to a second embodiment described herein.

According to the second embodiment, as illustrated in FIG. 5, a first $TiO_2$ film is formed by performing a first cycle $n_1$ times, the first cycle including a halogen-based source gas supply step, a residual gas removing step, an oxygen-containing gas supply step and a residual gas removing step, which are sequentially and non-simultaneously performed, and a second $TiO_2$ film is formed by performing a second cycle $n_2$ times, the second cycle including an organic source gas supply step, a residual gas removing step, an oxygen-containing gas supply step and a residual gas removing step, which are sequentially and non-simultaneously performed, where $n_1$ and $n_2$ are integers equal to or more than 1. Then, a resultant $TiO_2$ film is formed.

According to the second embodiment, by forming a laminated film constituted by an organic film having tensile stress and an inorganic film having compressive stress by controlling the ratio of the thickness of the organic film to thickness of the inorganic film, the laminated film having a desired stress may be formed on the wafer 200. For example, in order to minimize the stress of the laminated film, the ratio of the thickness of the organic film to the thickness of the inorganic film is controlled such that the stress of the organic film having compressive stress is equal to the stress of the inorganic film having tensile stress. In order to obtain a laminated film having compressive stress, the ratio of the thickness of the organic film to the thickness of the inorganic film is controlled such that the absolute value of the stress of the organic film having compressive stress is larger than the absolute value of the stress of the inorganic film having tensile stress. In order to obtain a laminated film having tensile stress, the ratio of the thickness of the organic film to the thickness of the inorganic film is controlled such that the absolute value of the stress of the inorganic film having tensile stress is larger than the absolute value of the stress of the organic film having compressive stress. As the laminated film constituted by the first $TiO_2$ film as an inorganic $TiO_2$ film having tensile stress and the second $TiO_2$ film as an organic $TiO_2$ film having compressive stress is be formed by controlling the ratio of the thickness of the first $TiO_2$ film to the thickness of the second $TiO_2$ film, a laminated film ($TiO_2$ film) having a desired stress may be formed on the wafer 200.

Since the film obtained through the second embodiment is a laminated film constituted by an inorganic film and an organic film as in the first embodiment, the film can be uniformly removed by the etching process described with reference to FIGS. 8A through 8C and 9A and 9B.

According to the second embodiment, the top layer of the laminated film is an organic film formed by the organic source gas. When brush cleaning is performed, the brush cleaning is of advantage for the organic film because the organic film has a hydrophobic property (waterproofing property).

The effects according to the second embodiment can be also obtained when another halogen-based source gas as well as $TiCl_4$ gas is used as the source gas, when another organic source gas as well as TIPT gas is used as the source gas, or when another oxygen-containing gas as well as $O_3$ gas is used as the reactive gas.

Third Embodiment

In a third embodiment, the detailed descriptions of the same portions as those of the first embodiment are omitted, and different portions from those of the first embodiment will be described.

Figure 6:
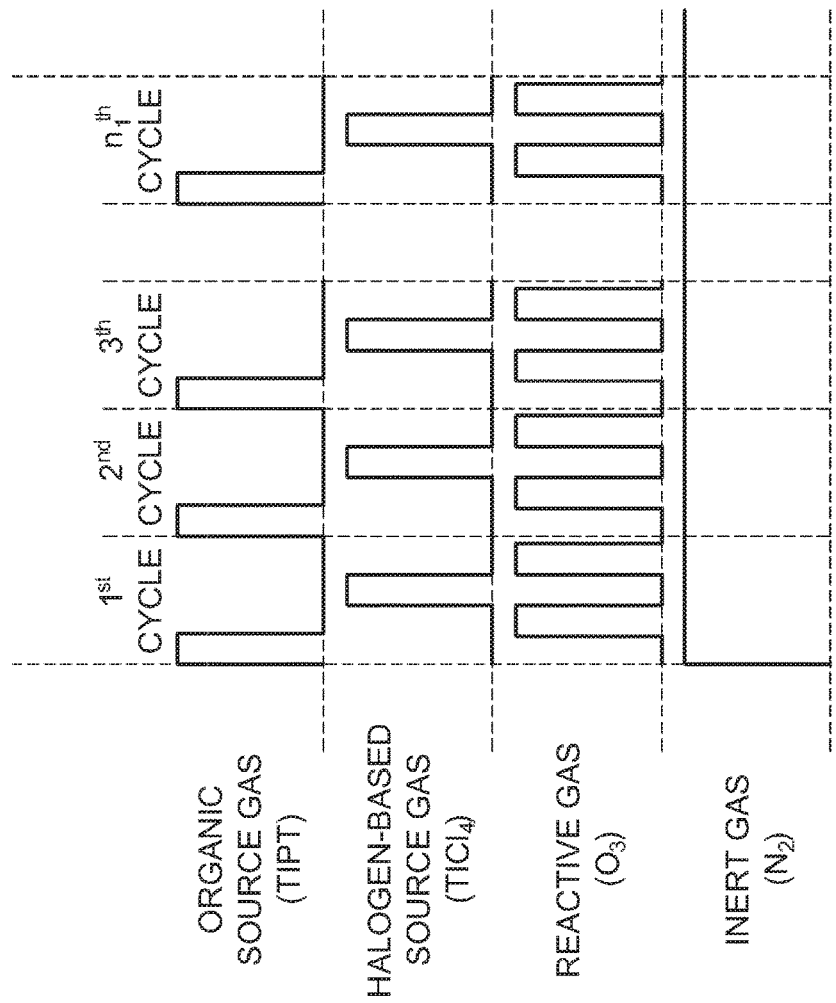
FIG. 6 is a diagram illustrating a sequence according to a third embodiment described herein.

According to the third embodiment, as illustrated in FIG. 6, a $TiO_2$ film is formed on the wafer 200 by performing a cycle $n_1$ times, the cycle including an organic source gas supply step, a residual gas removing step, an oxygen-containing gas supply step, a residual gas removing step, a halogen-based source gas supply step, a residual gas removing step, an oxygen-containing gas supply step and a residual gas removing step, which are sequentially and non-simultaneously performed, where $n_1$ is an integer equal to or more than 1.

According to the third embodiment, the top layer of the $TiO_2$ film is an inorganic film formed by a halogen-based source gas. When batch cleaning is performed, the batching cleaning is of advantage for the inorganic film because the inorganic film has a hydrophile property. The compatibility between the inorganic film having a hydrophile property and photoresist is better than the compatibility between the organic film and photoresist.

Fourth Embodiment

In a fourth embodiment, the detailed descriptions of the same portions as those of the first embodiment are omitted, and different portions from those of the first embodiment will be described.

Figure 7:
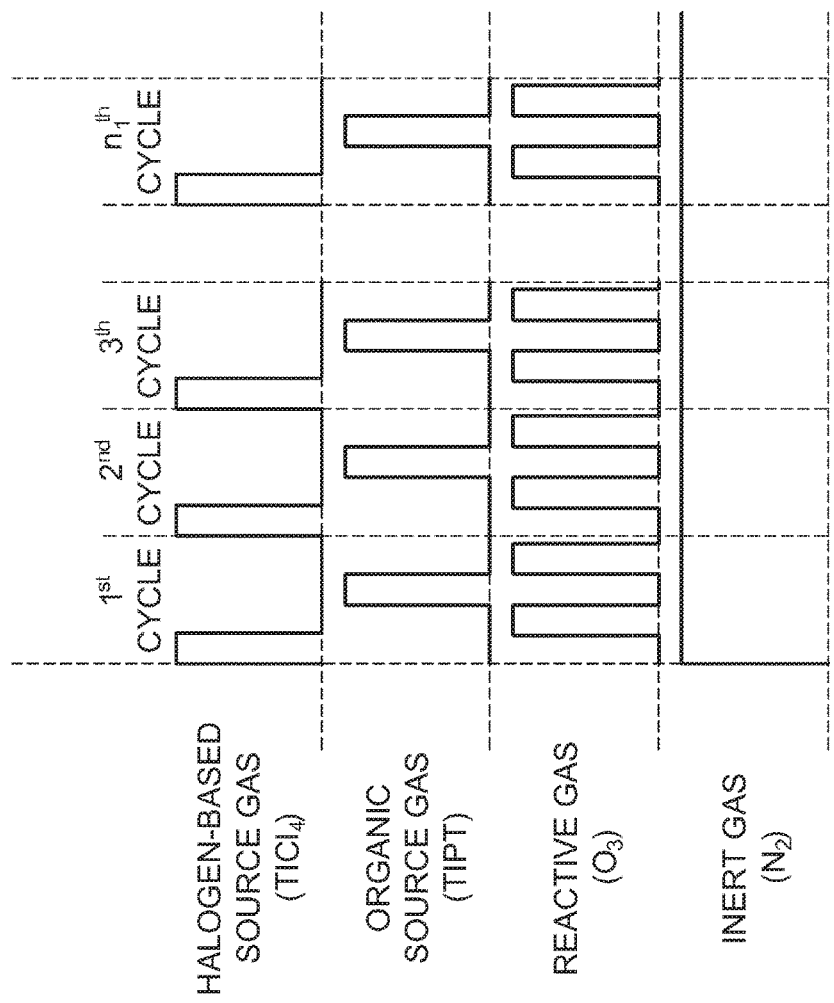
FIG. 7 is a diagram illustrating a sequence according to a fourth embodiment described herein.

According to the fourth embodiment, as illustrated in FIG. 7, a $TiO_2$ film is formed on the wafer 200 by performing a cycle $n_1$ times, the cycle including a halogen-based source gas supply step, a residual gas removing step, an oxygen-containing gas supply step, a residual gas removing step, an organic source gas supply step, a residual gas removing step, an oxygen-containing gas supply step and a residual gas removing step, which are sequentially and non-simultaneously performed, where $n_1$ is an integer equal to or more than 1.

According to the fourth embodiment, the top layer of the $TiO_2$ film is an organic film formed by an organic source gas. When brush cleaning is performed, the brush cleaning is of advantage for the organic film because the organic film has a hydrophobic property (waterproofing property).

Fifth Embodiment

In a fifth embodiment, the detailed descriptions of the same portions as those of the first embodiment are omitted, and different portions from those of the first embodiment will be described.

According to the fifth embodiment, a first $TiO_2$ film is formed by performing a first cycle $n_1$ times, the first cycle including an organic source gas supply step, a residual gas removing step, an oxygen-containing gas supply step and a residual gas removing step, which are sequentially and non-simultaneously performed, a second $TiO_2$ film is formed by performing a second cycle $n_2$ times, the second cycle including a halogen-based source gas supply step, a residual gas removing step, an oxygen-containing gas supply step and a residual gas removing step, which are sequentially and non-simultaneously performed, and a third $TiO_2$ film is formed by performing a third cycle $n_3$ times, the third cycle including an organic source gas supply step, a residual gas removing step, an oxygen-containing gas supply step and a residual gas removing step, which are sequentially and non-simultaneously performed, where $n_1$, $n_2$ and $n_3$ are integers equal to or more than 1. Then, a resultant $TiO_2$ film is formed.

According to the fifth embodiment, by forming a laminated film constituted by a first organic film having compressive stress, an inorganic film having tensile stress and a second organic film having compressive stress by controlling the ratio of the thickness of the first and second organic films to the thickness of the inorganic film, the laminated film having a desired stress may be formed on the wafer 200. For example, in order to minimize the stress of the laminated film, the ratio of the thickness of the first and second organic films to the thickness of the inorganic film is controlled such that the stress of the first and second organic films having compressive stress is equal to the stress of the inorganic film having tensile stress. In order to obtain a laminated film having compressive stress, the ratio of the thickness of the first and second organic films to the thickness of the inorganic film is controlled such that the absolute value of the stress of the first and second organic films having compressive stress is larger than the absolute value of the stress of the inorganic film having tensile stress. In order to obtain a laminated film having tensile stress, the ratio of the thicknesses of the first and second organic films to the thickness of the inorganic film is controlled such that the absolute value of the stress of the inorganic film having tensile stress is larger than the absolute value of the stress of the first and second organic films having compressive stress. As the laminated film constituted by the first and third $TiO_2$ films (first and second organic films) having compressive stress and the second $TiO_2$ film (inorganic film) having tensile stress is formed by controlling the ratio of the thicknesses of the first to third $TiO_2$ films, a $TiO_2$ film (laminated film) having a desired stress may be formed on the wafer 200.

According to the fifth embodiment, the top layer of the laminated film is an organic film formed by the organic source gas. When brush cleaning is performed, the brush cleaning is of advantage for the organic film because the organic film has a hydrophobic property (waterproofing property).

Since the film obtained by the fifth embodiment is a laminated film constituted by an organic film, an inorganic film and an organic film, the film can be uniformly removed by the etching process described with reference to FIGS. 8A through 8C and 9A and 9B.

Sixth Embodiment

In a sixth embodiment, the detailed descriptions of the same portions as those of the first embodiment are omitted, and different portions from those of the first embodiment will be described.

According to the sixth embodiment, a first $TiO_2$ film is formed by performing a first cycle $n_1$ times, the first cycle including a halogen-based source gas supply step, a residual gas removing step, an oxygen-containing gas supply step and a residual gas removing step, which are sequentially and non-simultaneously performed, a second $TiO_2$ film is formed by performing a second cycle $n_2$ times, the second cycle including an organic source gas supply step, a residual gas removing step, an oxygen-containing gas supply step and a residual gas removing step, which are sequentially and non-simultaneously performed, and a third $TiO_2$ film is formed by performing a third cycle $n_3$ times, the third cycle including a halogen-based source gas supply step, a residual gas removing step, an oxygen-containing gas supply step and a residual gas removing step, which are sequentially and non-simultaneously performed, where $n_1$, $n_2$ and $n_3$ are integers equal to or more than 1. Then, a resultant $TiO_2$ film is formed.

According to the sixth embodiment, by forming a laminated film constituted by a first inorganic film having tensile stress, an organic film having compressive stress and a second inorganic film having tensile stress by controlling the ratio of the thickness of the first and second inorganic films to the thickness of the organic film, the laminated film having a desired stress may be formed on the wafer 200. For example, in order to minimize the stress of the laminated film, the ratio of the thickness of the organic film to the thickness of the first and second inorganic films is controlled such that the stress of the organic film having compressive stress is equal to the stress of the first and second inorganic films having tensile stress. In order to obtain a laminated film having compressive stress, the ratio of the thickness of the organic film to the thickness of the first and second inorganic films is controlled such that the absolute value of the stress of the organic film having compressive stress is larger than the absolute value of the stress of the first and second inorganic films having tensile stress. In order to obtain a laminated film having tensile stress, the ratio of the thickness of the organic film to the thickness of the first and second inorganic films is controlled such that the absolute value of the stress of the first and second inorganic films having tensile stress is larger than the absolute value of the stress of the organic film having compressive stress. As the laminated film constituted by the first and third $TiO_2$ films (first and second inorganic films) having tensile stress and the second $TiO_2$ film (organic film) having compressive stress is formed by controlling the ratio of the thicknesses of the first to third $TiO_2$ films, a $TiO_2$ film (laminated film) having a desired stress may be formed on the wafer 200.

According to the sixth embodiment, the top layer of the laminated film is an inorganic film formed by a halogen-based source gas. When batch cleaning is performed, the batching cleaning is of advantage for the inorganic film because the inorganic film has a hydrophile property. The compatibility between the inorganic film having a hydrophile property and photoresist is better than the compatibility between the organic film and photoresist.

Since the film obtained by the sixth embodiment is a laminated film constituted by the first inorganic film, the organic film and the second inorganic film, the film can be uniformly removed by the etching process described with reference to FIGS. 8A through 8C and 9A and 9B.

By performing the respective processes a predetermined number of times in the same manner as the above-described embodiments, a film (laminated film) is formed on the wafer 200. At this time, the stress of the formed film may be set to a desired value by controlling the numbers $n_1$ through $n_3$ of times that the first through third cycles are performed.

Seventh Embodiment

In a seventh embodiment, the detailed descriptions of the same portions as those of the first embodiment are omitted, and different portions from those of the first embodiment will be described.

According to the seventh embodiment, a laminated film constituted by first and second $TiO_2$ films is formed as a resultant $TiO_2$ film by performing a third cycle $n_3$ times, the third cycle including: a step (a) of forming the first $TiO_2$ film by performing a first cycle $n_1$ times, the first cycle including an organic source gas supply step, a residual gas removing step, an oxygen-containing gas supply step and a residual gas removing step, which are sequentially and non-simultaneously performed; and a step (b) of forming the second $TiO_2$ film by performing a second cycle $n_2$ times, the second cycle including a halogen-based source gas supply step, a residual gas removing step, an oxygen-containing gas supply step and a residual gas removing step, which are sequentially and non-simultaneously performed, where $n_1$, $n_2$ and $n_3$ are integers equal to or more than 1. Preferably, $n_3$ may be set to an integer equal to or more than 2, and the plurality of first and second $TiO_2$ films may be alternately laminated.

According to the seventh embodiment, by forming a laminated film constituted by an organic film having compressive stress and an inorganic film having tensile stress by controlling the ratio of the thickness of the organic film to the thickness of the inorganic film, the laminated film having a desired stress may be formed on the wafer 200. For example, in order to minimize the stress of the laminated film, the ratio of the thickness of the organic film to the thickness of the inorganic film is controlled such that the stress of the organic film having compressive stress is equal to the stress of the inorganic film having tensile stress. In order to obtain a laminated film having compressive stress, the ratio of the thickness of the organic film to the thickness of the inorganic film is controlled such that the absolute value of the stress of the organic film having compressive stress is larger than the absolute value of the stress of the inorganic film having tensile stress. In order to obtain a laminated film having tensile stress, the ratio of the thickness of the organic film to the thickness of the inorganic film is controlled such that the absolute value of the stress of the inorganic film having tensile stress is larger than the absolute value of the stress of the organic film having compressive stress. As a laminated film constituted by a first $TiO_2$ film serving as an organic $TiO_2$ film having compressive stress and a second $TiO_2$ film serving as an inorganic $TiO_2$ film having tensile stress is formed by controlling the ratio of the thickness of the first $TiO_2$ film to the thickness of the second $TiO_2$ film, a $TiO_2$ film (laminated film) having a desired stress may be formed on the wafer 200.

According to the seventh embodiment, since the organic films and the inorganic films are alternately laminated, the thicknesses of the organic films and the inorganic films in the laminated film can be more easily controlled.

According to the seventh embodiment, the top layer of the laminated film is an inorganic film formed by the halogen-based source gas. When batch cleaning is performed, the batching cleaning is of advantage for the inorganic film because the inorganic film has a hydrophile property. The compatibility between the inorganic film having a hydrophile property and photoresist is better than the compatibility between the organic film and photoresist.

Since the film obtained in the seventh embodiment is a laminated film in which the inorganic films and the organic films are alternately laminated, the film can be uniformly removed by the etching process described with reference to FIGS. 8A through 8C and 9A and 9B.

Eighth Embodiment

In an eighth embodiment, the detailed descriptions of the same portions as those of the first embodiment are omitted, and different portions from those of the first embodiment will be described.

According to the eighth embodiment, a laminated film of first and second $TiO_2$ films is formed as a resultant $TiO_2$ film by performing a third cycle $n_3$ times, the third cycle including: a step (a) of forming the first $TiO_2$ film by performing a first cycle $n_1$ times, the first cycle including a halogen-based source gas supply step, a residual gas removing step, an oxygen-containing gas supply step and a residual gas removing step, which are sequentially and non-simultaneously performed; and a step (b) of forming the second $TiO_2$ film by performing a second cycle $n_2$ times, the second cycle including an organic source gas supply step, a residual gas removing step, an oxygen-containing gas supply step and a residual gas removing step, which are sequentially and non-simultaneously performed, where $n_1$, $n_2$ and $n_3$ are integers equal to or more than 1. Preferably, $n_3$ may be set an integer equal to or more than 2, and the plurality of first and second $TiO_2$ films may be alternately laminated.

According to the eighth embodiment, by forming a laminated film constituted by an inorganic film having tensile stress and an organic film having compressive stress by controlling the ratio of the thickness of the organic film to the thickness of the inorganic film, the laminated film having a desired stress may be formed on the wafer 200. For example, in order to minimize the stress of the laminated film, the ratio of the thickness of the organic film to the thickness of the inorganic film is controlled such that the stress of the organic film having compressive stress is equal to the stress of the inorganic film having tensile stress. In order to obtain a laminated film having compressive stress, the ratio of the thickness of the organic film to the thickness of the inorganic film is controlled such that the absolute value of the stress of the organic film having compressive stress is larger than the absolute value of the stress of the inorganic film having tensile stress. In order to obtain a laminated film having tensile stress, the ratio of the thickness of the organic film to the thickness of the inorganic film is controlled such that the absolute value of the stress of the inorganic film having tensile stress is larger than the absolute value of the stress of the organic film having compressive stress.

According to the eighth embodiment, since the inorganic films and the organic films are alternately laminated, the thicknesses of the inorganic films and the organic films in the laminated film can be more easily controlled.

According to the eighth embodiment, the top layer of the laminated film is an inorganic film formed by the halogen-based source gas. When batch cleaning is performed, the batching cleaning is of advantage for the inorganic film because the inorganic film has a hydrophile property. The compatibility between the inorganic film having a hydrophile property and photoresist is better than the compatibility between the organic film and photoresist.

Since the film obtained in the eighth embodiment is a laminated film in which the inorganic films and the organic films are alternately laminated, the film can be uniformly removed by the etching process described with reference to FIGS. 8A through 8C and 9A and 9B.

Other Embodiments

The above-described embodiments may be properly combined and used. Furthermore, the technique described herein is not limited to the above-described embodiments, and may be modified in various manners without departing from the purpose.

For example, titanium is used as a metal element in the above-described embodiment. However, the technique described herein is not limited thereto. For example, even when elements such as zirconium (Zr), hafnium (Hf), aluminum (Al), tungsten (W), tantalum (Ta) as well as Ti are used, the technique according to the above-described embodiments can be applied.

For example, the technique according to the above-described embodiments can be applied even when films such as zirconium oxide ($ZrO_2$), hafnium oxide ($HfO_2$), aluminum oxide ($Al_2O_3$), tungsten oxide ($WO_3$) and tantalum oxide ($Ta_2O_5$) are formed.

In the above-described embodiments, $TiCl_4$ is used as a halogen-based source gas. In addition to $TiCl_4$, however, gases such as tetrafluorotitanium ($TiF_4$), tetrachlorozirconium ($ZrCl_4$), tetrafluorozirconium ($ZrF_4$), tetrachlorohafnium ($HfCl_4$), tetrafluorohafnium ($HfF_4$), trichloroaluminum ($AlCl_3$), trifluoroaluminum ($AlF_3$), hexachlorotungsten ($WCl_6$), hexafluorotungsten ($WF_6$), pentachlorotantalum ($TaCl_5$), and pentafluorotantalum ($TaF_5$) may be used.

In the above-described embodiments, TIPT gas was used as an organic source gas. In addition to the TIPT gas, however, the following gases may be used: chlorotri(N-ethylmethylamino) titanium ($Ti[N(CH_3)CH_2CH_3]_3Cl$, abbreviated to TIA), tetrakis(diethylamino) titanium ($Ti[N(CH_2CH_3)_2]_4$, abbreviated to TDEAT), tetrakis(dimethylamino) titanium ($Ti[N(CH_3)_2]_4$, abbreviated to TDMAT), tetrakis(ethylmethylamino) zirconium ($Zr[N(CH_3)CH_2CH_3]_4$, abbreviated to TEMAZ), tetrakis(dimethylamino) zirconium ($Zr[N(CH_3)_2]_4$, abbreviated to TDMAZ), tetrakis(diethylamino) zirconium ($Zr[N(C_2H_5)_2]_4$, abbreviated to TDEAZ), tris(dimethylamino)(cyclopentadienyl) zirconium ($(C_5H_5)Zr[N(CH_3)_2]_3$), tetrakis(ethylmethylamino) hafnium ($Hf[N(CH_3)CH_2CH_3]_4$, abbreviated to TEMAH), tetrakis(dimethylamino) hafnium ($Hf[N(CH_3)_2]_4$, abbreviated to TDMAH), tetrakis(diethylamino) hafnium (Hf[N($C_2H_5$)$_2$]$_4$, abbreviated to TDEAH), trimethyl aluminum (($CH_3$)$_3$Al), abbreviated to TMA), bis(tertiarybutylamino) bis(tertiarybutylamino) tungsten (($C4H_9$NH)$_2$($C_4H_9$N)$_2$), tungsten hexacarbonyl (W(CO)$_6$), pentaethoxy tantalum (Ta(O$C_2H_5$)$_5$, abbreviated to PET), tris[ethyl(methyl)amino] (tertiarybutylamino) tantalum (Ta[NC($CH_3$)$_3$][N($C_2H_5$)$CH_3$]$_3$, abbreviated to TBTEMT), (tertiaryamylimido)tris (dimethylamino) tantalum (Ta[NC($CH_3$)$_2$$C_2H_5$][N(CH3)$_2$]$_3$, abbreviated to TAIMAITA).

In the above-described embodiments, $O_3$ gas is used as a reactive gas. In addition to $O_3$ gas, however, gases such as plasma-excited oxygen ($O_2$), vapor ($H_2O$), hydrogen peroxide ($H_2O_2$), nitrous oxide ($N_2O$) and a gas mixture of plasma-excited $O_2$ and $H_2$ may be used.

In the above-described embodiment, $N_2$ gas was used as an inert gas. The inert gas is not limited thereto. In addition to $N_2$ gas, rare gases such as Ar gas, He gas, Ne gas and Xe gas may be used as the inert gas.

In the above-described embodiments, a $TiO_2$ film is formed after photoresist is formed on the wafer 200. However, before the photoresist is formed, an annealing process may be performed on the wafer 200 at not more than a crystallization temperature of the $TiO_2$ film, for example, a temperature of 80° C. to 150° C. Since the strain of the wafer 200 is removed through the annealing process, a stress caused by the strain of the wafer 200 can be prevented from being applied to the $TiO_2$ film formed later.

In the above-described embodiments, a film is formed by the substrate processing apparatus which is a batch-type vertical apparatus for processing a plurality of substrates at a time and has a structure in which a nozzle for supplying a process gas into one reaction tube is vertically installed and an exhaust port is installed at the lower portion of the reaction tube. However, the technique according to the above-described embodiments may be applied even when a film is formed through a process furnace having a different structure. For example, the technique according to the above-described embodiments may be applied even when a film is formed by a process furnace which includes two reaction tubes having concentric cross-sectional surfaces (the outer reaction tube is referred to as an outer tube and the inner outer reaction tube is referred to as an inner tube), supplies a process gas through a nozzle vertically installed in the inner tube, and exhausts the process gas through an exhaust port opened at a position (axisymmetric position) facing the nozzle through the substrate and the sidewall of the outer tube. Furthermore, the technique according to the above-described embodiments may be applied even when the process gas is not supplied through the nozzle installed vertically in the inner tube, but supplied through a gas supply port opened at the sidewall of the inner tube. In this case, the exhaust port formed at the outer tube may be opened to correspond to the level at which a plurality of substrates stacked and housed in the process chamber are disposed. The exhaust port may have a hole shape or slit shape.

In the above-described embodiments, a film was formed through the substrate processing apparatus which is a batch-type vertical apparatus for processing a plurality of substrates at a time. However, the technique according to the above-described embodiments is not limited thereto, but may be applied even when a film is formed by a single-wafer type substrate processing apparatus which processes one or more substrates at a time. In the above-described embodiments, a thin film is formed through the substrate processing apparatus including a hot wall-type process furnace. However, the technique according to the above-described embodiments is not limited thereto, but may be applied even when a thin film is formed through a substrate processing apparatus including a cold wall-type process furnace. In this case, the same process condition as the above-described embodiments may be applied.

The process recipe used for forming the above-described various films may be separately prepared for each of the contents of the substrate processing step (the type, composition ratio, quality and thickness of a thin film to be formed and the process sequence and process condition). The process recipe is a program having the process sequence or process condition described therein. When the substrate processing step is started, a proper process recipe may be selected from the plurality of process recipes, depending on the contents of the substrate processing step. Specifically, a plurality of process recipes which are separately prepared for the respective contents of the substrate processing step may be stored (installed) in the memory device 121c included in the substrate processing apparatus through a communication line or a recording medium (external memory device 123) in advance, the recording medium storing the plurality of process recipes. When the substrate processing step is started, the CPU 121a installed in the substrate processing apparatus may select a proper process recipe according to the contents of the substrate processing step, among the plurality of process recipes stored in the memory device 121c. Thus, various types of thin films having various composition ratios, qualities and thicknesses can be universally formed with excellent reproducibility through one substrate processing apparatus. Furthermore, an operation burden of an operator who needs to input a process sequence or condition can be reduced, and substrate processing can be rapidly started while an operation miss is avoided.

The technique according to the above-described embodiments can be achieved by changing the process recipe of an existing substrate processing apparatus, for example. When the process recipe is modified, the process recipe according to the technique described herein may be installed in the existing substrate processing apparatus through the communication line or a recording medium storing the process recipe, or an I/O device of the existing substrate processing apparatus may be operated to change the process recipe to the process recipe according to the technique described herein.

The technique described herein can be applied to a method of manufacturing a semiconductor device and a substrate processing apparatus for processing a substrate such as a semiconductor wafer and a glass substrate.

What is claimed is:

1. A method of manufacturing a semiconductor device, comprising:
   (a) supplying an organic source gas containing a first element and a reactive gas containing a second element to a substrate having a photoresist pattern formed thereon while heating the substrate to a temperature ranging from 25° C. to 100° C. to form a first film on the photoresist pattern, wherein the first film has compressive stress and contains the first element and the second element; and (b) supplying an inorganic source gas containing the first element and the reactive gas to the substrate while heating the substrate to a temperature ranging from 25° C. to 100° C. to form a second film on the first film, wherein the second film has tensile stress and contains the first element and the second element, whereby a film comprising a laminated structure of the first film and the second film is formed on the photoresist pattern, the film having a predetermined stress by controlling a ratio of a thickness of the first film to a thickness of the second film, the predetermined stress being smaller than a stress of the photoresist pattern for forming a sidewall spacer in Self-Aligned Double Patterning.

2. The method of claim 1,
wherein the step (a) comprises:
(a-1) supplying the organic source gas to the substrate and removing the organic source gas, wherein the organic source gas further contains carbon;
(a-2) supplying the reactive gas to the substrate and removing the reactive gas; and
(a-3) repeating the step (a-1) and the step (a-2) to form the first film having a thickness ($t_x$) and a compressive stress ($\sigma_1$), wherein the step (b) comprises:
(b-1) supplying the inorganic source gas to the substrate and removing the inorganic source gas, wherein the inorganic source gas is free of carbon;
(b-2) supplying the reactive gas to the substrate and removing the reactive gas; and
(b-3) repeating the step (b-1) and the step (b-2) to form the second film having a thickness ($t_y$) and a tensile stress ($\sigma_2$), and wherein the predetermined stress of the film ($\sigma_3$) satisfies an equation $$\frac{\sigma_1}{t_x} - \frac{\sigma_2}{t_y} = \sigma_3.$$

3. The method of claim 2, wherein the ratio is controlled such that the predetermined stress of the film ($\sigma_3$) is zero.

4. The method of claim 1, wherein a top layer of the film comprises one of the first film and the second film selected according to a cleaning method of the substrate.

5. The method of claim 4, wherein the top layer comprises the first film when the cleaning method is batch cleaning, and the top layer comprises the second film when the cleaning method is brush cleaning.

6. The method of claim 2, wherein the predetermined stress of the film ($\sigma_3$) is a tensile stress smaller than the stress of the photoresist pattern in case where the stress of the photoresist pattern is a tensile stress.

7. The method of claim 2, wherein the predetermined stress of the film ($\sigma_3$) is a compressive stress smaller than the stress of the photoresist pattern in case where the stress of the photoresist pattern is a compressive stress.

* * * * *